United States Patent
Murakami

(10) Patent No.: US 10,101,865 B2
(45) Date of Patent: Oct. 16, 2018

(54) WIRING BODY, WIRING BOARD, AND TOUCH SENSOR

(71) Applicant: FUJIKURA LTD., Tokyo (JP)

(72) Inventor: Makoto Murakami, Chiba (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 15/508,853

(22) PCT Filed: Jan. 29, 2016

(86) PCT No.: PCT/JP2016/052796
§ 371 (c)(1),
(2) Date: Mar. 3, 2017

(87) PCT Pub. No.: WO2016/121972
PCT Pub. Date: Aug. 4, 2016

(65) Prior Publication Data
US 2017/0277290 A1 Sep. 28, 2017

(30) Foreign Application Priority Data
Jan. 30, 2015 (JP) .................................. 2015-016897

(51) Int. Cl.
*G06F 3/044* (2006.01)
*H05K 1/02* (2006.01)
(Continued)

(52) U.S. Cl.
CPC .............. *G06F 3/044* (2013.01); *G06F 3/041* (2013.01); *H05K 1/0296* (2013.01); *H05K 3/20* (2013.01);
(Continued)

(58) Field of Classification Search
CPC ..................................................... G06F 3/044
See application file for complete search history.

(56) References Cited

U.S. PATENT DOCUMENTS

| 5,201,268 A | 4/1993 | Yamamoto et al. |
| 9,910,552 B2 * | 3/2018 | Shiojiri ................... G06F 3/041 |

(Continued)

FOREIGN PATENT DOCUMENTS

| JP | H04-240792 A | 8/1992 |
| JP | H04-241489 A | 8/1992 |

(Continued)

OTHER PUBLICATIONS

Japanese First Official Action issued in application No. 2015-016897 dated Jan. 5, 2016 (3 pages).

(Continued)

*Primary Examiner* — Patrick R Marinelli
(74) *Attorney, Agent, or Firm* — Osha Liang LLP

(57) ABSTRACT

A wiring body includes a conductive portion that includes a contact surface having a concave-convex shape, and an adhesive layer stacked on the contact surface. The conductive portion further includes a top surface facing the contact surface that contains conductive particles. The adhesive layer includes a smooth portion with a smooth main surface provided at a constant thickness, and a protrusion that protrudes from the main surface toward a side of the conductive portion provided on the smooth portion to correspond to the conductive portion. The protrusion comes into contact with the contact surface and includes a concave-convex surface complementary to the concave-convex shape of the contact surface. The contact surface is positioned on a side of the top surface with respect to the main surface and a unit length of the contact surface is larger than a unit length of the top surface.

8 Claims, 13 Drawing Sheets

(51) Int. Cl.
*H05K 3/20* (2006.01)
*H05K 3/38* (2006.01)
*G06F 3/041* (2006.01)

(52) U.S. Cl.
CPC ..... *H05K 3/38* (2013.01); *G06F 2203/04103* (2013.01); *H05K 2203/0502* (2013.01)

(56) References Cited

U.S. PATENT DOCUMENTS

| | | | |
|---|---|---|---|
| 9,983,448 B2* | 5/2018 | Suto | G06F 3/041 |
| 2008/0096366 A1 | 4/2008 | Aoki et al. | |
| 2008/0098596 A1 | 5/2008 | Kim et al. | |
| 2010/0230154 A1* | 9/2010 | Naito | B41M 3/006 174/389 |
| 2011/0122596 A1* | 5/2011 | Miyazaki | H05K 9/0096 361/818 |
| 2011/0310489 A1* | 12/2011 | Kajiya | G02B 3/0056 359/601 |
| 2012/0138342 A1* | 6/2012 | Muramoto | G06F 3/0412 174/254 |
| 2014/0138143 A1* | 5/2014 | Lee | H05K 1/0213 174/268 |
| 2014/0184953 A1* | 7/2014 | Noh | G06F 3/041 349/12 |
| 2015/0014023 A1* | 1/2015 | Kim | H05K 1/097 174/251 |
| 2015/0223328 A1* | 8/2015 | Endoh | B32B 7/02 345/174 |
| 2015/0253910 A1* | 9/2015 | Lee | G06F 3/044 345/173 |
| 2017/0003773 A1* | 1/2017 | Kim | H05K 1/097 |
| 2017/0199412 A1* | 7/2017 | Suto | G06F 3/041 |
| 2017/0199600 A1* | 7/2017 | Shiojiri | G06F 3/041 |
| 2017/0277289 A1* | 9/2017 | Ogura | G06F 3/041 |
| 2017/0277290 A1* | 9/2017 | Murakami | G06F 3/041 |
| 2017/0277306 A1* | 9/2017 | Hondo | G06F 3/041 |
| 2017/0285786 A1* | 10/2017 | Hondo | G06F 3/041 |
| 2017/0293382 A1* | 10/2017 | Ishii | G06F 3/041 |

FOREIGN PATENT DOCUMENTS

| | | |
|---|---|---|
| JP | 2004-063943 A | 2/2004 |
| JP | 2004-071695 A | 3/2004 |
| JP | 2004-342648 A | 12/2004 |
| JP | 2006-114577 A | 4/2006 |
| JP | 2008-109141 A | 5/2008 |
| JP | 2008-141167 A | 6/2008 |
| JP | 2008-297386 A | 12/2008 |
| JP | 2009-158670 A | 7/2009 |
| JP | 2011-034889 A | 2/2011 |
| JP | 2011-096225 A | 5/2011 |

OTHER PUBLICATIONS

Japanese Second Official Action issued in application No. 2015-016897 dated Apr. 19, 2016 (2 pages).
Decision to Grant a Patent w/translation from Japanese Application No. 2016-539336 dated Sep. 30, 2016 (6pages).
Office Action issued in corresponding Chinese Application No. 201680002508.2 dated Nov. 2, 2017 (6 pages).
Extended European Search Report issued in corresponding European Application No. 16743575.9 dated Nov. 22, 2017 (5 pages).
Office Action in counterpart Chinese Patent Application No. 201680002508.2 dated Jun. 5, 2018 (15 pages).

* cited by examiner

WIRING BODY, WIRING BOARD, AND TOUCH SENSOR

TECHNICAL FIELD

The present invention relates to a wiring body, a wiring board, and a touch sensor.

In designated nations where incorporation of documents by reference is accepted, the contents disclosed in Japanese Patent Application No. 2015-016897, filed on Jan. 30, 2015 in Japan is incorporated by reference into this specification, and is regarded as a part of disclosure of this specification.

BACKGROUND ART

There has been a known circuit board having a conductor pattern which is formed when, after a groove portion of a concave portion is filled with organic metal ink, the organic metal ink is transferred to a target print body through curing resin to form a circuit pattern, and the circuit pattern is baked (for example, see Patent Document 1).

CITATION LIST

Patent Document

Patent Document 1: JP 4-240792 A

SUMMARY OF THE INVENTION

Problem to be Solved by the Invention

The above-described circuit board has a problem that a mechanical joining force between a resin layer of the hardening resin, etc. and a conductive portion of the organic metal ink, etc. is weak, and thus there is a concern that separation between the conductive portion and the resin layer may occur.

Problems to be solved by the present invention include providing a wiring body, a wiring board, and a touch sensor that attempt suppression of separation between a resin layer and a conductive portion.

Means for Solving Problem

[1] A wiring body according to the invention is a wiring body including a conductive portion including a first surface having a concave-convex shape including a concave portion and a convex portion in a section view in a longitudinal direction, and a second surface facing the first surface, and containing at least conductive particles, and a resin layer formed by being stacked on the first surface, in which the resin layer includes a smooth portion provided at a substantially constant thickness and having a substantially smooth main surface, and a protrusion provided on the smooth portion to correspond to the conductive portion, the protrusion protruding from the main surface toward a side of the conductive portion, the protrusion comes into contact with the first surface and includes a concave-convex surface complementary to the concave-convex shape of the first surface, the first surface is positioned on a side of the second surface with respect to the main surface, and the following Formula (1) is satisfied:

$$L_1 > L_2 \quad (1)$$

in the Formula (1), $L_1$ denotes a unit length of the first surface in the section view in the longitudinal direction, and $L_2$ denotes a unit length of the second surface in the section view in the longitudinal direction.

[2] In the above invention, the following Formula (2) may be satisfied:

$$S_2 > S_1 \geq 0.5 S_2 \quad (2)$$

in the Formula (2), $S_1$ denotes an average gap between the first surface and the second surface in the concave portion, and $S_2$ denotes an average gap between the first surface and the second surface in the convex portion.

[3] In the above invention, the first surface may include a waveform in which the concave portion and the convex portion are alternately continued, and the following Formula (3) may be satisfied:

$$100 D_1 \geq S_3 \geq 3 D_1 \quad (3)$$

in the Formula (3), $S_3$ denotes an average gap between adjacent convex portions, and $D_1$ denotes an average particle diameter of the conductive particles.

[4] In the above invention, the following Formula (4) may be satisfied:

$$S_4 \geq 3 D_2 \quad (4)$$

In the Formula (4), $S_4$ denotes an average gap between the first surface and the second surface in the concave portion, and $D_2$ denotes an average particle diameter of the conductive particles.

[5] In the above invention, an external shape of the conductive portion in a cross section in a short direction may include two straight line-shaped side surfaces inclined such that the side surfaces approach each other as being separated from the first surface.

[6] A wiring board according to the invention includes the above-described wiring body, and a support that supports the wiring body.

[7] A touch sensor according to the invention includes the above-described wiring board.

Effect of the Invention

According to the invention, a contact surface between a resin layer and a conductive portion corresponds to a shape having a concave-convex shape in a section view in a longitudinal direction, and the above Formula (1) is satisfied. In this way, a mechanical joining force between the resin layer and the conductive portion is improved, and separation between the resin layer and the conductive portion is suppressed.

MODE(S) FOR CARRYING OUT THE INVENTION

Hereinafter, an embodiment of the invention will be described based on drawings.

Figure 1:
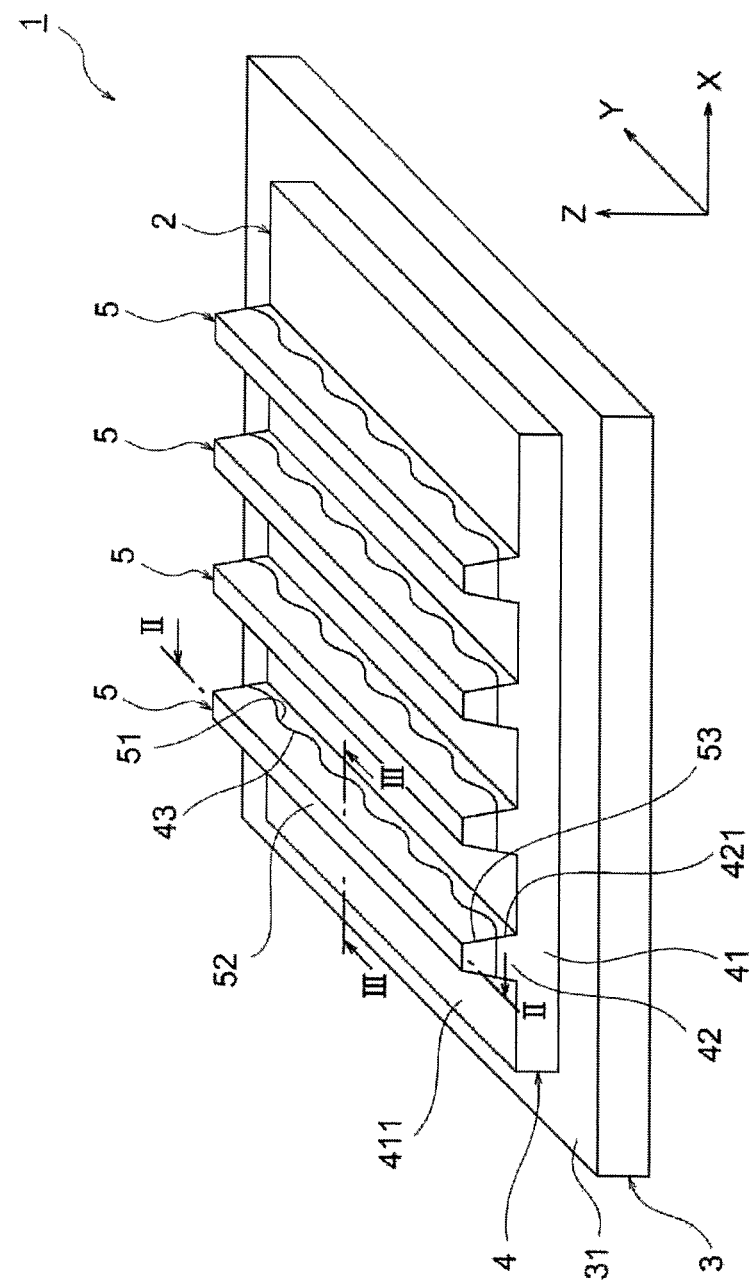
FIG. 1 is a perspective view illustrating a wiring board in an embodiment of the invention.
Figure 2:
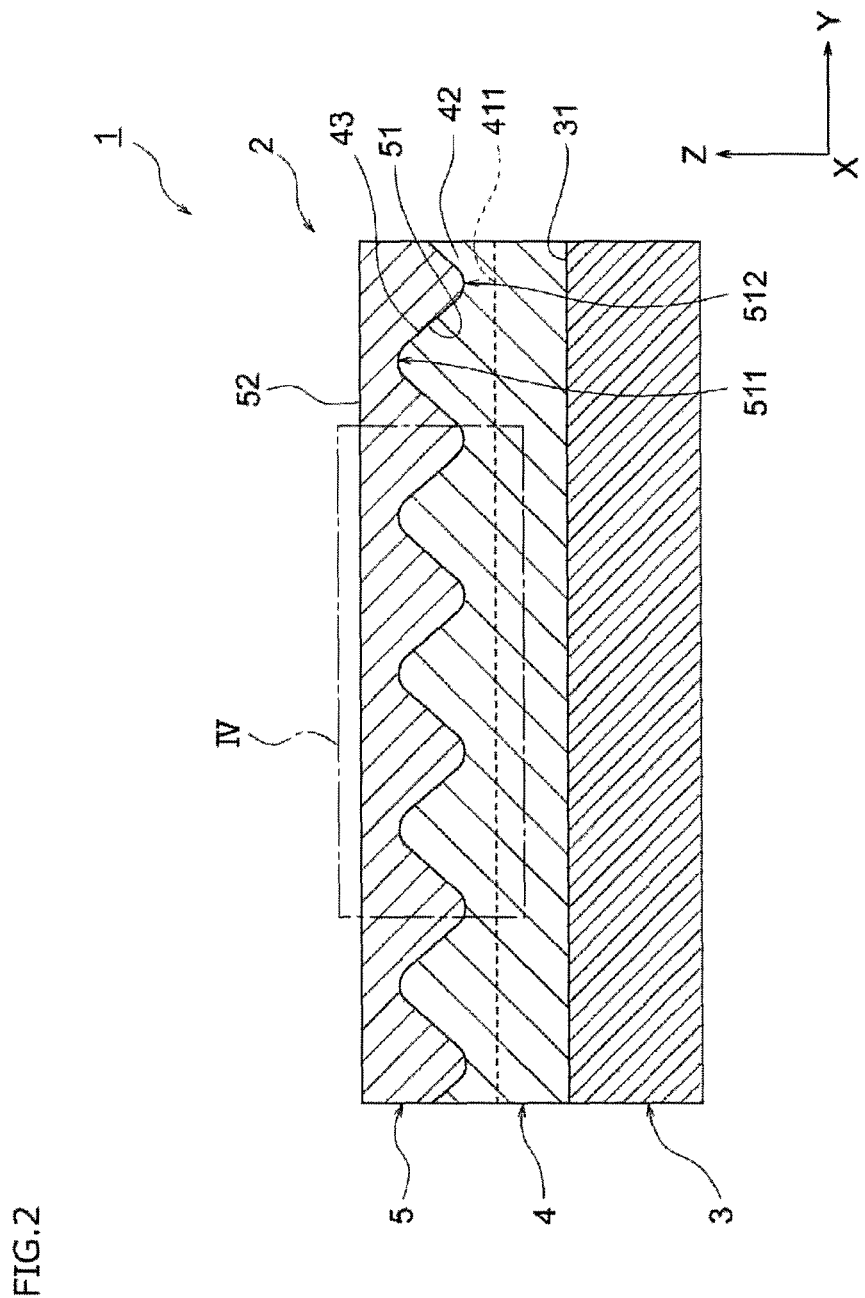
FIG. 2 is a cross sectional view taken along II-II line of FIG. 1.
Figure 3:
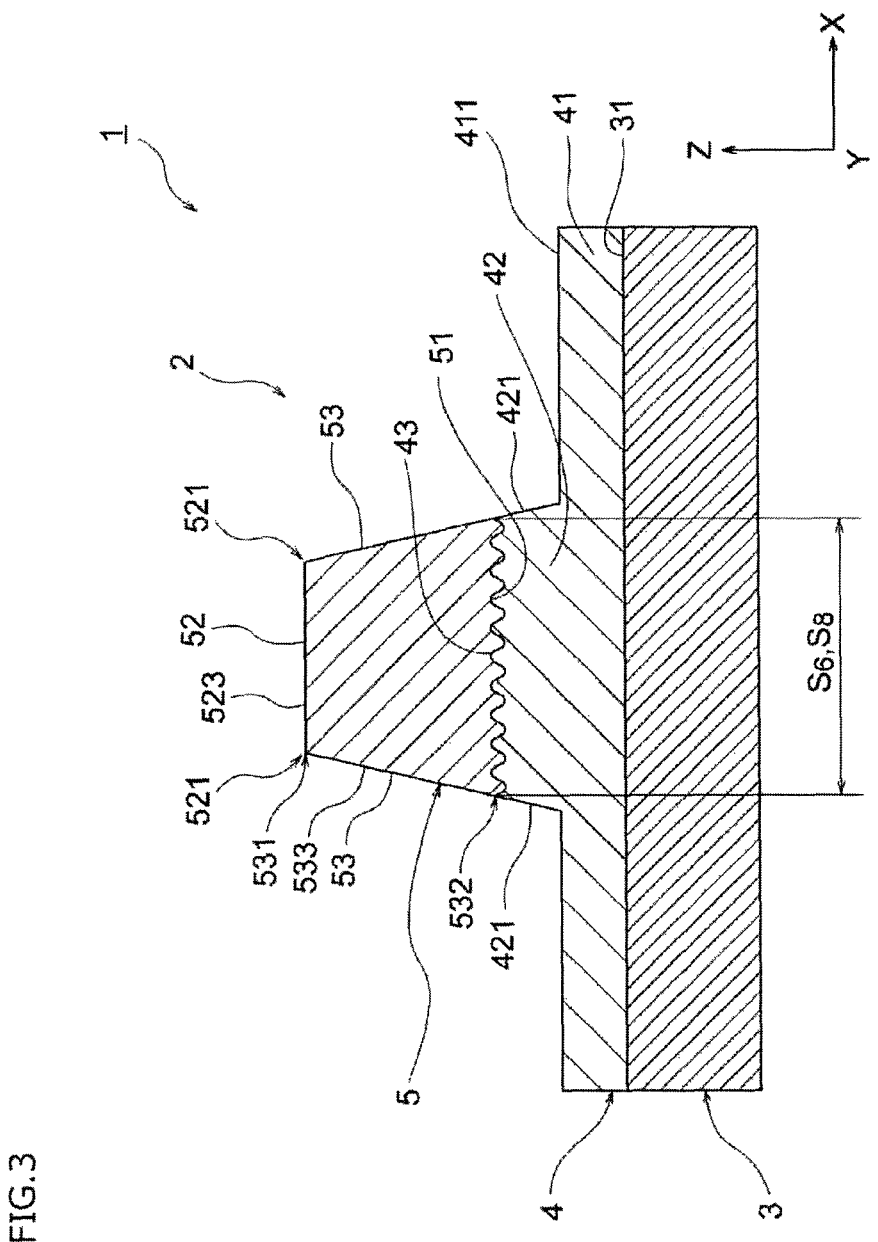
FIG. 3 is a cross sectional view taken along line of FIG. 1.
Figure 4:
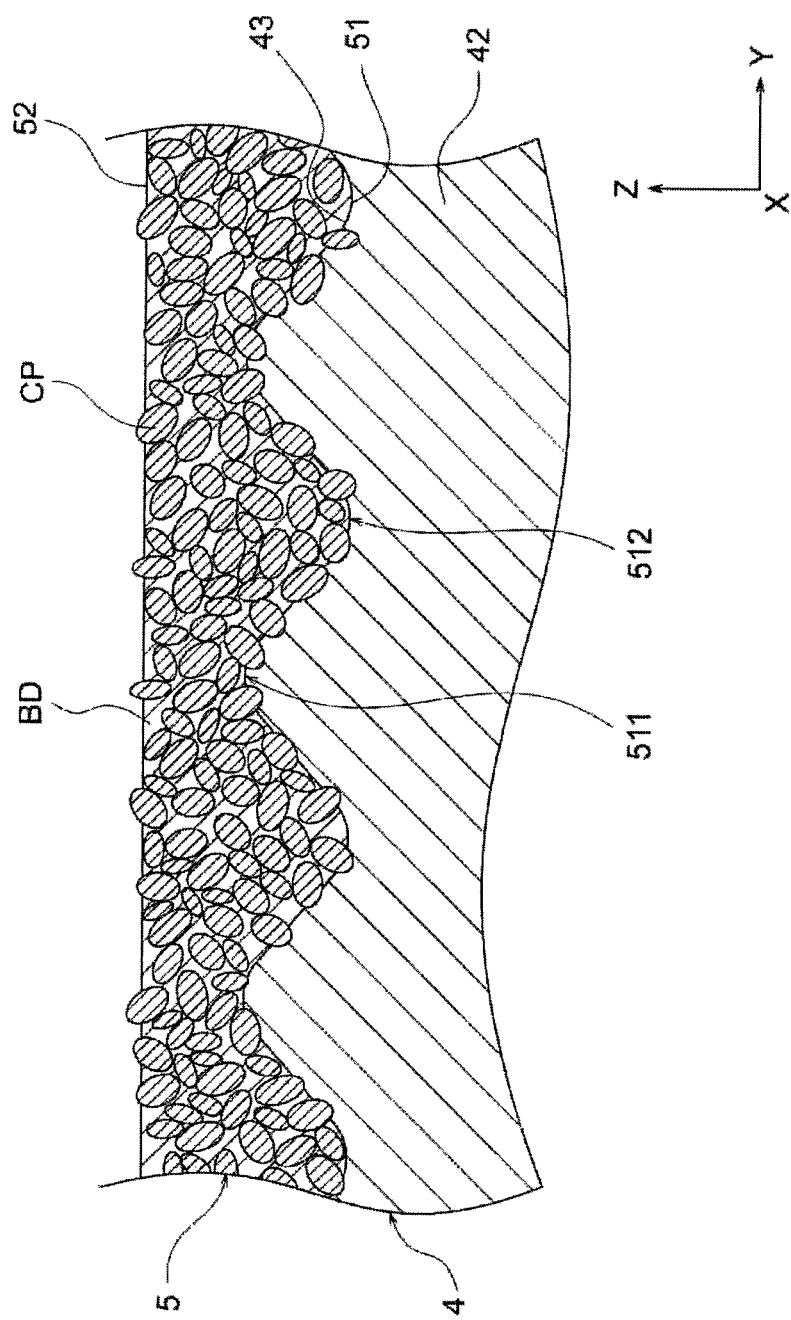
FIG. 4 is an enlarged view of an IV portion of FIG. 2.
Figure 5:
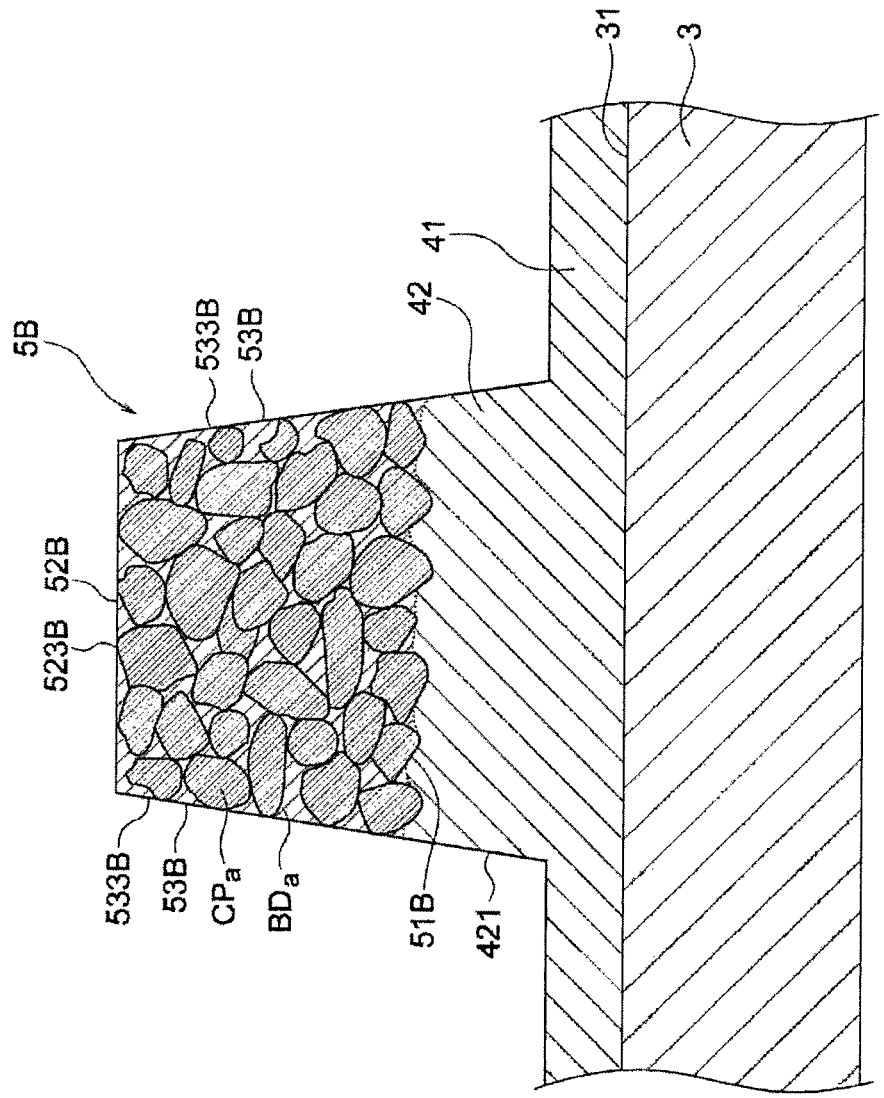
FIG. 5 is a cross sectional view in a short direction for description of a structure of a conductive portion in the embodiment of the invention.
Figure 6:
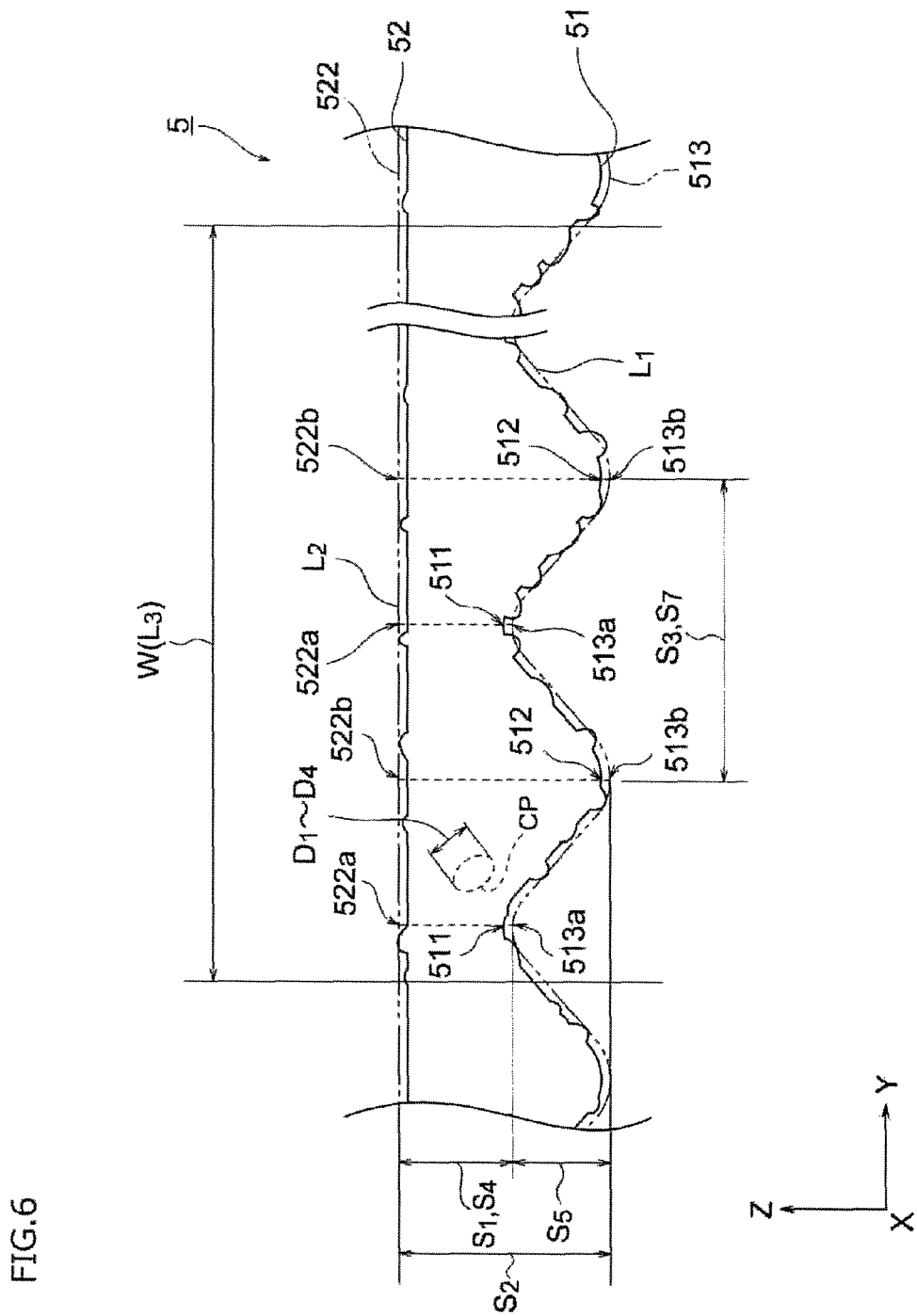
FIG. 6 is a cross sectional view in a longitudinal direction for description of the structure of the conductive portion in the embodiment of the invention.
Figure 7:
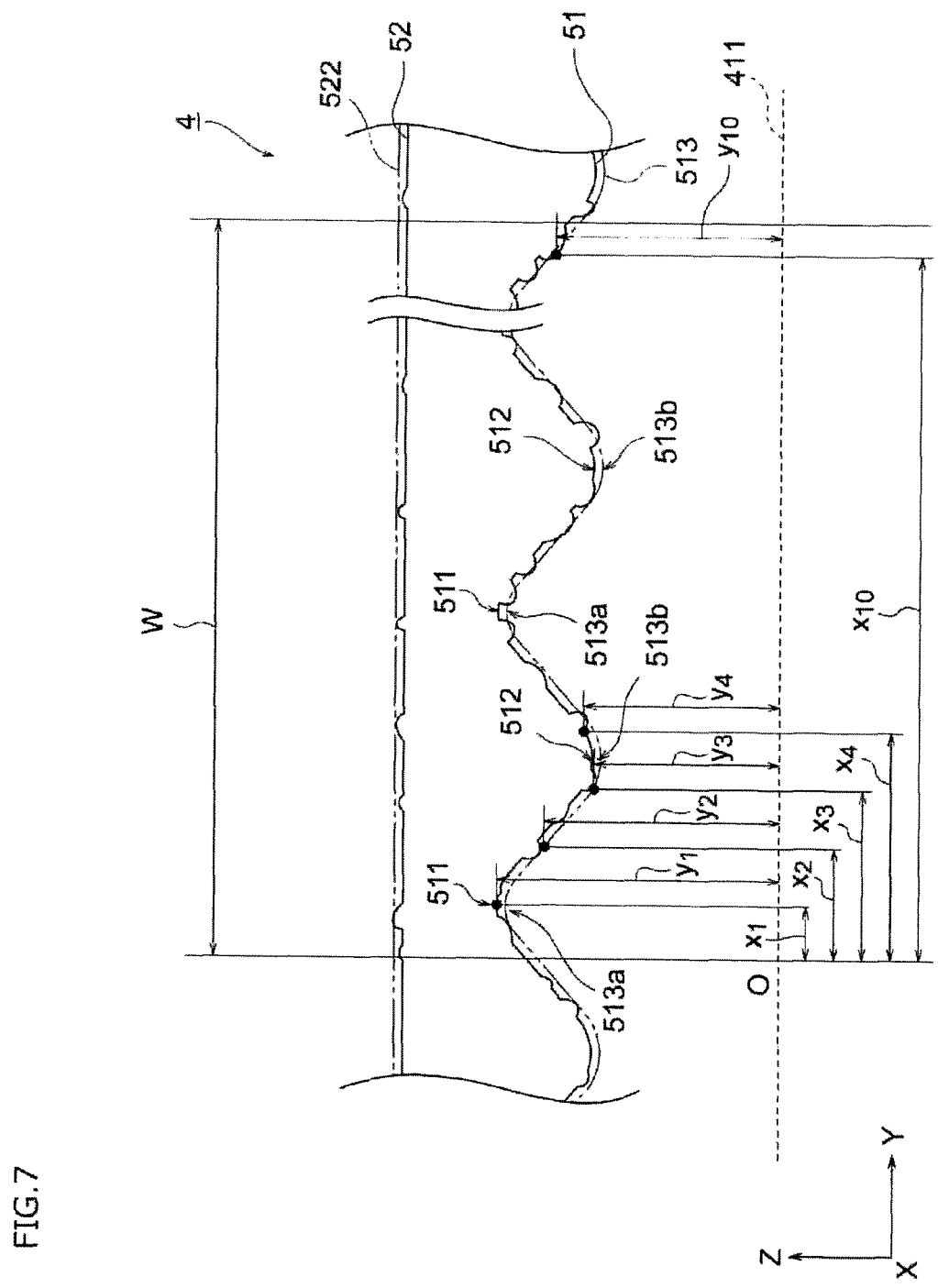
FIG. 7 is a diagram illustrating the conductive portion in the embodiment of the invention, and is a cross sectional view in a longitudinal direction for description of a method of obtaining a first approximate line of a contact surface of the conductive portion.

FIG. 1 is a perspective view illustrating a wiring board in an embodiment of the invention. FIG. 2 is a cross sectional view taken along II-II line of FIG. 1. FIG. 3 is a cross sectional view taken along III-III line of FIG. 1. FIG. 4 is an enlarged view of an IV portion of FIG. 2. FIG. 5 is a cross sectional view in a short direction for description of a structure of a conductive portion in the embodiment of the invention. FIG. 6 is a cross sectional view in a longitudinal direction for description of the structure of the conductive portion in the embodiment of the invention. FIG. 7 is a diagram illustrating the conductive portion in the embodiment of the invention, and is a cross sectional view in a longitudinal direction for description of a method of obtaining a first approximate line of a contact surface of the conductive portion.

For example, a wiring board 1 in the present embodiment is used as an electrode substrate of a touch panel or a touch sensor, and includes a substrate 3 and a wiring body 2 in which a conductive portion 5 is supported by the substrate 3 through an adhesive layer 4 as illustrated FIG. 1 to FIG. 3. In the wiring body 2 of the present embodiment, four straight line-shaped conductive portions 5 are provided substantially in parallel on the substrate 3. However, the invention is not particularly restricted thereto. For example, although not particularly illustrated, it is possible to employ a wiring body in which linear (straight line-shaped, curved line-shaped, etc.) conductive portions 5 are disposed in a lattice on the substrate 3 in a plan view. Use of the wiring board 1 is not particularly restricted. The "wiring body 2" in the present embodiment corresponds to an example of a "wiring body" in the invention, the "substrate 3" in the present embodiment corresponds to an example of a "support" in the invention, the "adhesive layer 4" the present embodiment corresponds to an example of a "resin layer", and the "conductive portion 5" in the present embodiment corresponds to an example of a "conductive portion" in the invention.

For example, the substrate 3 is made of an insulating film having flexibility. Examples of a material included in the insulating film may include polyethylene terephthalate (PET), polyethylene naphthalate (PEN), polyimide resin (PI), polyetherimide resin (PEI), polycarbonate (PC), polyether ether ketone (PEEK), liquid crystal polymer (LCP), cycloolefin polymer (COP), silicone resin (SI), acrylic resin, phenol resin, epoxy resin, green sheet, glass, etc. An easily adhesive layer or an optical adjustment layer may be formed in the substrate 3. When the wiring board 1 is used as the electrode substrate of the touch panel, transparent materials are selected as materials included in the substrate 3 and the adhesive layer 4, respectively.

The adhesive layer 4 serving as a resin layer in the present embodiment is a member bonding and fixing the substrate 3 and the conductive portion 5 to each other. Examples of a material included in the adhesive layer 4 may include a UV-curing resin, a thermosetting resin, or a thermoplastic resin such as epoxy resin, acrylic resin, polyester resin, urethane resin, vinyl resin, silicone resin, phenol resin, polyimide resin, etc. or ceramic. As illustrated in FIG. 1 to FIG. 3, the adhesive layer 4 in the present embodiment includes a smooth portion 41 provided on a main surface 31 of the substrate 3 and having a substantially constant thickness, and a protrusion 42 formed on the smooth portion 41. The "smooth portion 41" in the present embodiment corresponds to an example of a "flat portion" in the invention, and the "protrusion 42" in the present embodiment corresponds to an example of a "protrusion" in the invention.

The smooth portion 41 is uniformly provided to cover the main surface 31 of the substrate 3, and a main surface 411 of the smooth portion 41 is a surface substantially parallel to the main surface 31 of the substrate 3. In the present embodiment, the main surface 31 of the substrate 3 is a surface substantially parallel to a Y direction of FIG. 1 to FIG. 3.

The protrusion 42 is formed between the smooth portion 41 and the conductive portion 5, and provided to protrude in a direction away from the substrate 3 (+Z direction of FIG. 1). For this reason, a thickness (height) of the adhesive layer 4 in a portion in which the protrusion 42 is provided is larger than a thickness (height) of the adhesive layer 4 in the smooth portion 41. As illustrated in FIG. 3, the protrusion 42 includes two side surfaces 421 and 421, which have straight line shapes in a section view in a short direction and are inclined to be separated from each other as being separated from a contact surface 43 (described below). A thickness (height) of the smooth portion 41 refers to a distance from a surface of the adhesive layer 4 facing the main surface 31 of the substrate 3 to the main surface 411 in the Z direction (direction in which the adhesive layer 4 and the conductive portion 5 are stacked). Further, a thickness (height) of the protrusion 42 refers to a distance from a portion in which the smooth portion 41 and the protrusion 42 are connected to each other (that is, the same plane as the main surface 411) to the contact surface 43 in the Z direction (direction in which the adhesive layer 4 and the conductive portion 5 are stacked). A thickness (height) of the adhesive layer 4 in a portion in which the protrusion 42 is provided refers to a sum of the thickness (height) of the smooth portion 41 and the thickness (height) of the protrusion 42. The thickness (height) of the smooth portion 41 is preferably within a range of 5 μm to 2,000 μm, the thickness (height) of the protrusion 42 is preferably within a range of 0.65 μm to 33 μm, and a minimum thickness (height) of the protrusion 42 is preferably within a range of 0.35 μm to 17 μm. A maximum thickness (height) of the protrusion 42 refers to a thickness of the protrusion 42 in a portion corresponding to a concave portion 511 (described below) of a contact surface 51 (described below) of the conductive portion 5. The minimum thickness (height) of the protrusion 42 refers to a thickness of the protrusion 42 in a portion corresponding to a convex portion 512 (described below) of the contact surface 51 of the conductive portion 5.

The adhesive layer 4 of the present embodiment comes into contact with the conductive portion 5 (specifically, the contact surface 51) on the contact surface 43. As illustrated in FIG. 2, in response to the contact surface 51 of the conductive portion 5 having a concave-convex surface (details are described below) in a section view in a longitudinal direction, the contact surface 43 includes a concave-convex surface complementary to the concave-convex shape of the contact surface 51. In addition, the contact surface 43 is connected to the side surfaces 421 and 421 of the protrusion 42 at both ends thereof in the section view in the short direction.

As illustrated in FIG. 3, minute concave and convex portions are formed on the contact surface 43 in a cross section in the short direction when compared to a concavo-convex shape of the contact surface 43 in a cross section in a longitudinal direction. A concavo-convex shape of the contact surface 43 in the cross section in the short direction is formed based on surface roughness of the contact surface 51 of the conductive portion 5. The surface roughness of the contact surface 51 will be described below in detail. In FIG. 3, a concavo-convex shape at a boundary between the protrusion 42 and the conductive portion 5 in the cross section in the short direction is exaggeratingly illustrated to describe the wiring body 2 in the present embodiment in an easily understood manner.

The conductive portion 5 is stacked on the protrusion 42 of the adhesive layer 4, and formed to protrude in the +Z direction in FIG. 1 to FIG. 3. As illustrated in FIG. 4, the conductive portion 5 includes a conductive particle CP and a binder resin BD. In the conductive portion 5, conductive particles CP is substantially evenly dispersed in the binder resin BD, and conductivity is assigned to the conductive portion 5 when conductive particles CP come into contact with each other. In the present embodiment, some of the conductive particles CP are exposed from the binder resin BD. However, the invention is not restricted thereto. The conductive particles CP may not be exposed from the binder resin BD. Incidentally, in FIG. 4, the conductive particles CP fill the conductive portion 5 to have a gap between conductive particles CP for convenience of description. However, in the actual wiring body 2 (the wiring board 1), the conductive particles CP densely fill the conductive portion 5 when compared to description in FIG. 4.

The conductive portion 5 is formed by applying and hardening conductive paste. Specific examples of the conductive paste may include conductive paste configured by mixing the conductive particles CP with the binder resin BD, water or a solvent, and various addition agents. Specific examples of the conductive particles CP may include conductive powder or metal salt. Examples of the conductive powder may include a metal material such as silver, copper, nickel, tin, bismuth, zinc, indium, palladium, etc., or a carbon-based material such as graphite, carbon black (furnace black, acetylene black, Ketjen black), carbon nanotube, carbon nanofiber, etc. Examples of the metal salt may include salt of these metals.

For example, a conductive particle having a particle diameter D within a range of 0.01 μm to 2 μm ($0.01 \leq D \leq 2$) depending on a width of the formed conductive portion 5 may be used as a conductive particle CP contained in the conductive portion 5. It is preferable to use conductive particles having an average diameter φ which is half or less the width of the formed conductive portion 5 in terms of stabilizing electrical resistivity in the conductive portion 5.

In addition, when the carbon-based material is used as the conductive particle CP, it is preferable to use a particle, whose specific surface area measured by a BET method is 20 $m^2/g$ or more. The particle diameter D of the conductive particle CP is a general term for particle diameters $D_1$ to $D_4$ described below.

When relatively small electrical resistivity of a certain value or less is required for the conductive portion 5, the metal material is preferably used as the conductive particle CP. However, when relatively large electrical resistance value of a certain value or more is allowed for the conductive portion 5, the carbon-based material is preferably used as the conductive particle CP. Using the carbon-based material as the conductive particle is preferable in terms of improving haze or total light reflectance of a mesh film.

Examples of the binder resin BD may include acrylic resin, polyester resin, epoxy resin, vinyl resin, urethane resin, phenol resin, polyimide resin, silicone resin, fluoride resin, etc. Examples of the solvent may include α-terpineol, butyl carbitol acetate, butyl carbitol, 1-decanol, butyl cellosolve, diethylene glycol monoethyl ether acetate, tetradecane, etc. The binder resin may be omitted from the material included in the conductive portion 5.

A width (maximum width) $S_6$, $S_8$ of the conductive portion 5 is preferably within a range of 50 nm to 1,000 μm, more preferably within a range of 500 nm to 150 μm, even more preferably within a range of 1 μm to 10 μm, and further even more preferably within a range of 1 μm to 5 μm. In addition, a thickness of the conductive portion 5 is preferably within a range of 50 nm to 3,000 μm, more preferably within a range of 500 nm to 450 μm, and even more preferably within a range of 500 nm to 10 μm.

As illustrated in FIG. 3, an external shape of the conductive portion 5 of the present embodiment includes the contact surface 51, a top surface 52, and two side surfaces 53 and 53. As illustrated in FIG. 2, the contact surface 51 has concave portions 511 and convex portions 512 in the section view in the longitudinal direction, and is set to a surface having a concave-convex shape. In addition, as illustrated in FIG. 3, the contact surface 51 is continuously formed between the side surfaces 53 and 53 in the section view in the short direction. The contact surface 51 is set to a surface having a concave-convex shape including minute concave and convex portions in the cross section in the short direction when compared to the concave and convex portions 511 and 512 formed in the cross section in the longitudinal direction. The contact surface 51 is positioned on the top surface 52 side with respect to the main surface 411 of the smooth portion 41 in the Z direction. In this case, the minute concave and convex portions of the contact surface 51 are included inside the protrusion 42 of the adhesive layer 4, and thus do not corrode the smooth portion 41 of the adhesive layer 4. For this reason, durability the resin layer 4 is improved. The "contact surface 51" in the present embodiment corresponds to an example of a "first surface" in the invention.

Meanwhile, the top surface 52 facing the contact surface is substantially parallel to the main surface 31 of the substrate 3. In addition, the top surface 52 is continuously formed through corner portions 521 and 521 between the side surfaces 53 and 53 in the section view in the short direction. The corner portions 521 and 521 preferably correspond to 90° to 170° ($90° \leq \theta \leq 170°$), and more preferably correspond to 90° to 120° ($90° \leq \theta \leq 120°$) in terms of suppressing diffused reflection of light on the side surface 53. In the present embodiment, an angle of the corner portion 521 between one side surface 53 and the top surface 52 is substantially equal to an angle of the corner portion 521 between the other side surface 53 and the top surface 52.

Referring to the top surface 52 in the present embodiment, when the corner portions 521 and 521 are formed as described above, a range between the corner portions 521 and 521 corresponds to an example of a "second surface" in the invention. When burr shapes are formed at portions corresponding to the corner portions 521 and 521, respectively, a range between the burr shapes corresponds to an example of the "second surface" in the invention. In addition, when R shapes are formed at the portions corresponding to the corner portions 521 and 521, respectively, a range between positions at which radii of curvatures of the R shapes correspond to minimum values or a range between central positions in a section view of the R shapes corresponds to an example of the "second surface" in the invention.

In the present embodiment, inclined angles of the respective side surfaces 421 and 421 are substantially equal to each other. However, the invention is not particularly restricted thereto, and the inclined angles of the respective side surfaces 421 and 421 may set to different inclined angles. In addition, similarly, inclined angles of the respective side surfaces 53 and 53 are substantially equal to each other. However, the invention is not particularly restricted thereto, and the inclined angles of the respective side surfaces 53 and 53 may set to different inclined angles. However, in one side surface, the inclined angle of the side surface 53 is substantially equal to the inclined angle of the side surface 421.

The top surface 52 includes a flat portion 523 in a cross section of the conductive portion 5 in a short direction. The flat portion 523 is a straight line-shaped portion (that is, a portion having an extremely large radius of curvature) present on the top surface 52 in the cross section of the conductive portion 5 in the short direction, and has flatness of 0.5 μm or less. The flatness may be measured by the JIS method (JIS B0621 (1984)).

In the present embodiment, the flatness of the flat portion 523 is obtained using a non-contact measurement scheme using laser light. Specifically, a measuring object (for example, the top surface 52 or the side surface 53) is irradiated with belt-shaped laser light, and an image of reflected light thereof is formed on an image pick-up device (for example, a two-dimensional (2D) CMOS) to measure the flatness. A scheme (maximum deflection-type flatness) is used as a scheme of calculating the flatness to set planes passing through three points separated from one another as much as possible on a target plane, and calculate a maximum value of deviations thereof as the flatness. A scheme of measuring or calculating the flatness is not particularly restricted to the above-described schemes. For example, a scheme of measuring the flatness may correspond to a contact-type measurement scheme using a dial gauge, etc. In addition, a scheme (maximum tilt-type flatness) may be used as a scheme of calculating the flatness to calculate a value of a gap, which is generated when a target plane is interposed between parallel planes, as the flatness.

The flat portion 523 of the present embodiment is formed on the substantially whole top surface 52. The invention is not particularly restricted to the above description, and the flat portion may be formed in a portion of the top surface. In this case, for example, the flat portion may be formed in a region not including both ends of the top surface. When the flat portion is formed in a portion of the top surface, a width of the flat portion is at least half or more a width of the top surface.

As illustrated in FIG. 3, the side surfaces 53 and 53 have straight line shapes in the section view in the short direction, and are formed to be inclined such that the side surfaces 53 and 53 approach each other (have a so-called tapered shape) as being separated from the contact surface 51. In addition, in the present embodiment, the side surfaces 53 and 53 join the side surfaces 421 and 421 at portions connected to the contact surface 51 (or the contact surface 43) in the section view in the short direction. The side surface 53 of the conductive portion 5 and the side surface 421 of the protrusion 42 in the adhesive layer 4 form one plane by being smoothly continued. In this case, the side surface 421 of the protrusion 42 preferably has a shape in which a hem of the protrusion 42 does not widen in a cross section of the conductive portion 5 in a width direction. Specifically, the side surface 421 preferably has a shape in which the side surface 421 is not recessed from a virtual straight line passing through a portion at which the side surface 421 is connected to the side surface 53 and a portion at which the side surface 421 is connected to the smooth portion 41.

The side surface 53 is positioned between the contact surface 51 and the top surface 52. The side surface 53 is connected to the top surface 52 at a first portion 531, and connected to the contact surface 51 at a second portion 532. In the present embodiment, the first portion 531 is identical to the corner portion 521. The conductive portion 5 of the present embodiment has a tapered shape, in which a width is narrowed as being separated from the adhesive layer 4, and thus the second portion 532 is positioned outside the first portion 531. The side surface 53 of the present embodiment is a surface having a straight line shape extending on a virtual straight line (not illustrated) passing through the first and second portions 531 and 532 in the cross section of the conductive portion 5 in the short direction.

The shape of the side surface 53 is not particularly restricted to the above-described shape. For example, the side surface 53 may protrude outward from the virtual straight line passing through the first and second portions 531 and 532 in the cross section of the conductive portion 5 in the short direction. In this way, the side surface 53 preferably has a shape which is not recessed inward from the virtual straight line passing through the first and second portions (a shape in which a hem of the conductive portion does not widen) in the cross section of the conductive portion 5 in the short direction.

The side surface 53 includes a flat portion 533 in the cross section of the conductive portion 5 in the width direction. The flat portion 533 is a portion having a straight line shape (that is, a portion having an extremely large radius of curvature) present on the side surface 53 in the cross section of the conductive portion 5 in the short direction, and has flatness of 0.5 μm or less. In the present embodiment, a portion of the side surface 53 extending to substantially match the virtual straight line is included in the flat portion 533. In other words, the flat portion 533 is formed substantially on the whole side surface 53. The invention is not particularly restricted to the above description, and the flat portion may be formed in a portion of the side surface.

A surface roughness of the contact surface 51 of the conductive portion 5 in the present embodiment is preferably rougher than a surface roughness of the top surface 52 of the conductive portion 5 in terms of strongly fixing the conductive portion 5 to the adhesive layer 4. In the present embodiment, the top surface 52 includes the flat portion 523, and thus the above-described relative relation with regard to surface roughness in the conductive portion 5 (a relation in which the surface roughness of the contact surface 51 is relatively rougher than the surface roughness of the top surface 52). Specifically, it is preferable that the surface roughness Ra of the contact surface 51 of the conductive portion 5 is within a range of about 0.1 µm to 3 µm, and the surface roughness Ra of the top surface 52 is within a range of about 0.001 µm to 1.0 µm. The surface roughness Ra of the contact surface 51 of the conductive portion 5 is more preferably within a range of 0.1 µm to 0.5 µm, and the surface roughness Ra of the top surface 52 is more preferably within a range of 0.001 µm to 0.3 µm. In addition, a ratio of the surface roughness of the top surface 52 to the surface roughness of the contact surface 51 (the surface roughness of the top surface 52 with respect to the surface roughness of the contact surface 51) preferably corresponds to 0.01 or more and less than 1, and more preferably corresponds to 0.1 or more and less than 1. In addition, the surface roughness of the top surface 52 is preferably ⅕ or less the width (maximum width) of the conductive portion 5. Such surface roughness may be measured by the JIS method (JIS B0601 (revised on Mar. 21, 2013)).

Incidentally, as described in the JIS method (JIS B0601 (revised on Mar. 21, 2013)), the "surface roughness Ra" herein refers to an "arithmetic average roughness Ra". This "arithmetic average roughness Ra" refers to a roughness parameter obtained by excluding a long wavelength component (waviness component) from a profile curve. The waviness component is separated from the profile curve based on a measurement condition (for example, dimensions of an object, etc.) necessary to obtain a form.

In addition, in the present embodiment, the side surface 53 includes the flat portion 533. In addition, similarly to the top surface 52, the surface roughness of the contact surface 51 is relatively rougher than the surface roughness of the side surface 53 including the flat portion 533. Specifically, with regard to the surface roughness Ra of the contact surface 51 described above, the surface roughness Ra of the side surface 53 is within a range of 0.001 µm to 1.0 µm. The surface roughness Ra of the side surface 53 is preferably within a range of 0.001 µm to 0.3 µm.

In the present embodiment, the top surface 52 includes the flat portion 523, and the side surface 53 includes the flat portion 533. In this case, a diffuse reflectance of the wiring body 2 on a side of surfaces except for contact surface 51 (that is, a side of surfaces including the top surface 52 and the side surface 53) is preferably relatively smaller than a diffuse reflectance of the wiring body 2 on a side of the contact surface 51. Specifically, a ratio of the diffuse reflectance of the wiring body 2 on the side of the surfaces except for the contact surface 51 to the diffuse reflectance of the wiring body 2 on the side of the contact surface 51 (the diffuse reflectance of the wiring body 2 on the side of the surfaces except for the contact surface 51 with respect to the diffuse reflectance of the wiring body 2 on the side of the contact surface 51) is preferably 0.1 or more and less than 1, and more preferably 0.3 or more and less than 1.

A description will be given of an example of a shape of a conductive portion 5B having the above-described relative relation between the surface roughness of the adhesive surface and the surface roughness of another surface with reference to FIG. 5. The conductive portion 5B illustrated in FIG. 5 includes a conductive particle CPa and a binder resin BDa. In addition, in a cross section of the conductive portion 5B in a short direction, some of conductive particles CPa protrude from the binder resin BDa on a contact surface 51B. In this way, the contact surface 51B has a concavo-convex shape. Meanwhile, in a cross section of the conductive portion 5B in a width direction, the binder resin BDa penetrates between conductive particles CPa, and the binder resin BDa covers the conductive particles CPa on a top surface 52B and a side surface 53B. In this way, a flat portion 523B is formed on the top surface 52B. In addition, a flat portion 533B is formed on the side surface 53B. When the conductive particles CPa are covered by the binder resin BDa on the top surface 52B and the side surface 53B, electric insulation between adjacent conductive portions 5 is improved, and generation of migration is suppressed.

In a mode illustrated in FIG. 5, since some of the conductive particles CPa protrude from the binder resin BDa on the contact surface 51B, surface roughness of the contact surface 51B is relatively large. On the other hand, since the conductive particles CPa are covered by the binder resin BDa on the top surface 52B, surface roughness of the top surface 52B is relatively small. In this way, the surface roughness of the contact surface 51B is rougher than the surface roughness of the top surface 52B.

In addition, similarly to the top surface 52B, since the conductive particles CPa are covered by the binder resin BDa on the side surface 53B, surface roughness of the side surface 53B is relatively small. In this way, the surface roughness of the contact surface 512 is rougher than the surface roughness of the side surface 53B. Shapes of an adhesive surface, a top portion, and a side portion are not restricted to the mode illustrated in FIG. 5 when the shapes have the above-described relative relation with regard to the surface roughness.

In the present embodiment, as illustrated in FIG. 6, since the contact surface 51 includes the concave-convex shape, and the top surface 52 (specifically, the flat portion 523) includes the straight line shape in the section view in the longitudinal direction, Formula (5) below is satisfied.

$$L_1 > L_2 \qquad (5)$$

However, in the above Formula (5), $L_1$ denotes a unit length of the contact surface 51 in the section view in the longitudinal direction, and $L_2$ denotes a unit length of the top surface 52 in the section view in the longitudinal direction.

In the above Formula (5), the unit length of the contact surface 51 and the unit length of the top surface 52 are obtained as below. In more detail, with regard to the unit length of the contact surface 51, first, an arbitrary reference surface and a unit region W are set as illustrated in FIG. 7. In the present embodiment, the arbitrary reference surface is set to the main surface 411 of the smooth portion 41. In addition, the unit region W is set to a region having a width, a length of which corresponds to the unit length of the contact surface 51, in the cross section in the longitudinal direction. Further, within the unit region W, positions based on the reference surface are obtained with respect to arbitrary measurement positions (ten positions of P1 to P10 in the present embodiment) on the contact surface 51. That is, coordinates (xi, yi) of each measurement position Pi (i=1 to 10) on an YZ plane is obtained in the present embodiment. An origin O in YZ plane coordinates is regarded as an intersection point between a boundary of the unit region W and the reference surface. Then, a first approximate line 513 of the contact surface 51 is calculated by an approximation method based on an obtained value. A length of the first approximate line 513 in the section view in the longitudinal direction in the unit region W is set to the unit length of the contact surface 51. Specific examples of the approximation method may include a polynomial approximation method using a least squares method.

In addition, similarly, with regard to the unit length of the top surface 52, a position based on the reference surface is obtained at an arbitrary measurement position on the top surface 52 within the unit region W. Then, a second approximate line 522 of the top surface 52 is calculated by an approximation method such as polynomial approximation based on an obtained value. A length of the second approximate line 522 in the section view in the longitudinal direction in the unit region W is set to the unit length of the top surface 52.

In the present embodiment, in order to eliminate an influence of a minute concavo-convex shape due to conductive particles CP exposed from the contact surface 51, a gap between adjacent measurement positions is set to three times or more an average particle diameter of the conductive particles CP.

In the present embodiment, the average particle diameter of the conductive particles CP is obtained using a scanning electron microscope (SEM) or a transmission electron microscope (TEM). Specifically, an arithmetic mean value of particle diameters of a plurality of (at least 100) conductive particles CP measured by the SEM or the TEM is set to the average particle diameter of the conductive particles CP. When the shape of the conductive particle CP corresponds to an ellipsoid having a minor axis and a major axis, a rod shape, or a shape having a concept of an aspect ratio, a side (or a diameter) in a longitudinal direction is measured as the particle diameter of the conductive particle CP. In addition, when the average particle diameter of the conductive particles CP is obtained, conductive particles CP whose particle diameters (that is, sides in the longitudinal direction in the particle diameters of the conductive particles CP) are less than 100 nm are excluded from the measuring object ($\varphi \geq 100$ nm). In addition, conductive particles CP in an aggregate state or conductive particles CP having distorted external shapes are excluded from the measuring object. Incidentally, examples of the conductive particles CP in the aggregate state may include conductive particles CP adhering to each other to have a flake shape.

The concave portion 511 of the present embodiment is a portion on the contact surface 51 corresponding to a an inflection point 513a at which a gradient of a curve is changed from a positive value to a negative value in the above-described first approximate line 513 in the cross section in the longitudinal direction (see FIG. 7). In addition, the convex portion 512 is a portion on the contact surface 51 corresponding to a an inflection point 513b at which the gradient of the curve is changed from a negative value to a positive value in the above-described first approximate line 513 in the cross section in the longitudinal direction (see FIG. 7).

When a length of the unit region W in the longitudinal direction is set to 20 μm, the unit length $L_1$ of the contact surface 51 is preferably within a range of 20.1 μm to 30 μm, and the unit length $L_2$ of the top surface 52 is preferably within a range of 20 μm to 21 μm. In addition, a ratio of the unit length $L_1$ of the contact surface 51 to the unit length $L_2$ of the top surface 52 (the unit length $L_1$ of the contact surface 51 with respect to the unit length $L_2$ of the top surface 52) is preferably within a range of 1.01 to 1.43, and more preferably within a range of 1.05 to 1.30.

In addition, in the present embodiment, as illustrated in FIG. 6, Formula (6) is satisfied in terms of improving a mechanical joining force between the adhesive layer 4 and the conductive portion 5, and preventing damage to the conductive portion 5.

$$S_2 > S_1 \geq 0.5 S_2 \tag{6}$$

However, in the above Formula (6), $S_1$ denotes an average gap between the contact surface 51 and the top surface 52 in the concave portion 511, and $S_2$ denotes an average gap between the contact surface 51 and the top surface 52 in the convex portion 512.

In the present embodiment, the average gap between the contact surface 51 and the top surface 52 in the concave portion 511 is obtained as below. That is, a gap between the inflection point 513a and a projection point 522a obtained by projecting the inflection point 513a onto the second approximate line 522 along the Z direction is obtained at a plurality of (at least ten) positions, and an arithmetic mean value of obtained gaps between the contact surface 51 and the top surface 52 in the concave portion 511 is set to the average gap between the contact surface 51 and the top surface 52 in the concave portion 511.

Similarly, the average gap between the contact surface 51 and the top surface 52 in the convex portion 512 is obtained as below. That is, a gap between the inflection point 513b and a projection point 522b obtained by projecting the inflection point 513b onto the second approximate line 522 along the Z direction is obtained at a plurality of (at least ten) positions, and an arithmetic mean value of obtained gaps between the contact surface 51 and the top surface 52 in the convex portion 512 is set to the average gap between the contact surface 51 and the top surface 52 in the convex portion 512.

The average gap between the contact surface 51 and the top surface 52 may not be obtained using the above-described scheme. For example, gaps between the contact surface 51 and the top surface 52 in the concave portion 511 (or the convex portion 512) at ten or more positions may be measured using the SEM or the TEM, and an arithmetic mean value of obtained gaps between the contact surface 51 and the top surface 52 may be set to the average gap between the contact surface 51 and the top surface 52 in the concave portion 511 (or the convex portion 512).

In the present embodiment, the gap between the contact surface 51 and the top surface 52 in the concave portion 511 and the gap between the contact surface 51 and the top surface 52 in the convex portion 512 are regarded as substantially constant thicknesses in the section view of the conductive portion 5 in the short direction when compared to the concave and convex portions in the cross section of the conductive portion 5 in the longitudinal direction despite an influence of the minute concave and convex portions in the cross section of the conductive portion 5 in the short direction.

An average gap $S_1$ between the contact surface 51 and the top surface 52 in the concave portion 511 is preferably within a range of 0.35 μm to 17 μm. In addition, an average gap $S_2$ between the contact surface 51 and the top surface 52 in the convex portion 512 is preferably within a range of 0.65 μm to 33 μm. An average between $S_1$ and $S_2$ may be used as the height (average height) of the conductive portion 5. However, a ratio of the thickness (height) of the protrusion 42 to the height of the conductive portion 5 is preferably within a range of 0.67 to 1.5.

In addition, as illustrated in FIG. 6, Formula (7) below is preferably satisfied in terms of further improving the mechanical joining force between the adhesive layer 4 and the conductive portion 5.

$$S_5 \geq 3 D_4 \tag{7}$$

However, in the above Formula (7), $S_5$ denotes an average height difference between the concave portion 511 and the convex portion 512, and $D_4$ denotes an average particle diameter of the conductive particles CP.

The average height difference between the concave portion 511 and the convex portion 512 is obtained as below. That is, a value obtained by subtracting the average gap between the contact surface 51 and the top surface 52 in the concave portion 511 from the average gap between the contact surface 51 and the top surface 52 in the convex portion 512 obtained as described above is set to the average height difference between the concave portion 511 and the convex portion 512.

The average height difference between the concave portion 511 and the convex portion 512 may not be obtained using the above-described scheme. For example, gaps between the contact surface 51 and the top surface 52 in the concave portion 511 at ten or more positions and gaps between the contact surface 51 and the top surface 52 in the convex portion 512 at ten or more positions may be measured using the SEM or the TEM, and a value obtained by subtracting an arithmetic mean value of the measured gaps between the contact surface 51 and the top surface 52 in the concave portion 511 from an arithmetic mean value of the measured gaps between the contact surface 51 and the top surface 52 in the convex portion 512 may be set to an average height difference between the concave portion 511 and the convex portion 512.

The average height difference $S_5$ between the concave portion 511 and the convex portion 512 is preferably within a range of 0.3 μm to 17 μm.

In the present embodiment, as illustrated in FIG. 6, the contact surface 51 includes a waveform in which the concave portion 511 and the convex portion 512 are alternately continued, and Formula (8) below is satisfied.

$$100D_1 \geq S_3 \geq 3D_1 \qquad (8)$$

However, in the above Formula (8), $S_3$ denotes an average gap between adjacent convex portions 512, and $D_1$ denotes the average particle diameter of the conductive particles CP.

In the present embodiment, the average gap between the adjacent convex portions 512 is obtained as below. That is, a gap between two adjacent inflection points 513b is obtained at positions, and an arithmetic mean value of obtained gaps between inflection points 513b is set to the average gap between the adjacent convex portions 512. In this case, the gap between the two adjacent inflection points 513b is measured at least at ten (that is, eleven inflection points 513b are present) or more positions.

The average gap between the adjacent convex portions 512 may not be obtained using the above-described scheme. For example, a gap between adjacent convex portions 512 may be measured at ten or more positions using the SEM or the TEM, and an arithmetic mean value of measured gaps between adjacent convex portions 512 may be set to the average gap between the adjacent convex portions 512.

The average gap $S_3$ between the adjacent convex portions 512 is preferably within a range of 3 μm to 20 μm.

In addition, as illustrated in FIG. 6, in the present embodiment, Formula (9) below is satisfied in terms of more reliably ensuring conductivity along an extending direction of the conductive portion 5. Further, Formula (10) below is more preferably satisfied (with regard to $S_6$, see FIG. 3).

$$S_4 \geq 3D_2 \qquad (9)$$

$$S_6 \geq 3D_4 \qquad (10)$$

However, in the above Formula (9), $S_4$ denotes the average gap between the contact surface 51 and the top surface 52 in the concave portion 511, and $D_2$ denotes the average particle diameter of the conductive particles CP. In addition, in the above Formula (10), $S_6$ denotes a maximum width of the conductive portion 5 in the section view in the short direction, and $D_4$ denotes the average particle diameter of the conductive particles CP.

The maximum width of the conductive portion 5 in the section view in the short direction is obtained as below. That is, a maximum width of the conductive portion 5 is measured at ten or more positions in the cross section in the short direction using the SEM or the TEM, and an arithmetic mean value of measured maximum widths of the conductive portion 5 is set to the maximum width of the conductive portion 5.

The average gap $S_4$ between the contact surface 51 and the top surface 52 in the concave portion 511 is preferably set within the same range as that of the above-described $S_1$.

In addition, as illustrated in FIG. 3 and FIG. 6, Formula (11) below is preferably satisfied in terms of further improving the mechanical joining force between the adhesive layer 4 and the conductive portion 5.

$$S_7 > S_8 \qquad (11)$$

However, in the above Formula (11), $S_7$ denotes an average gap between adjacent convex portions 512, and $S_8$ denotes the maximum width of the conductive portion 5 in the section view in the short direction.

The average gap $S_7$ between the adjacent convex portions 512 is preferably set within the same range as that of the above-described $S_3$.

Next, a description will be given of a method of manufacturing the wiring board 1 in the present embodiment. FIG. 8(a) to FIG. 8(e) are cross-sectional views for description of the method of manufacturing the wiring board 1 in the present embodiment.

Figure 8:
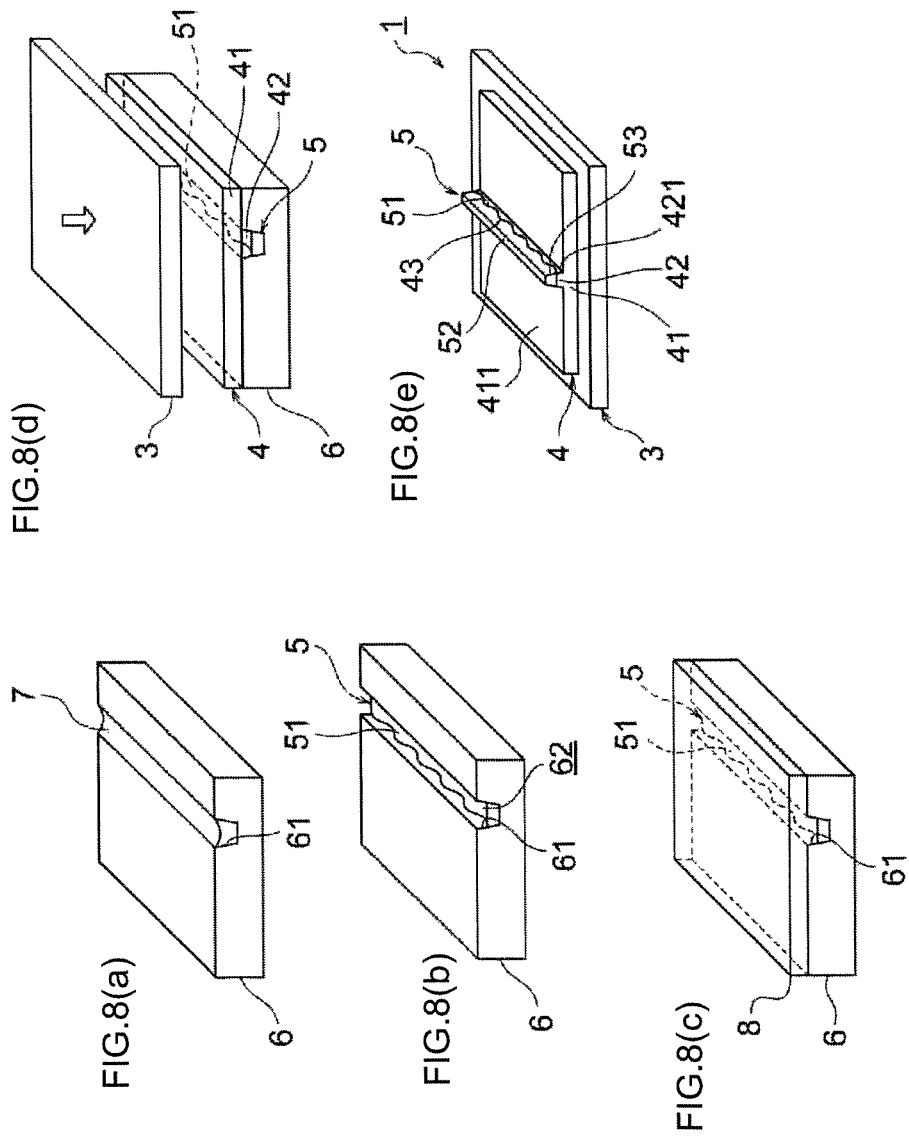
FIG. 8(a) to FIG. 8(e) are perspective views illustrating a method of manufacturing the wiring board in the embodiment of the invention.

First, as illustrated in FIG. 8(a), first, intaglio 6 in which a recessed portion 61 having a shape corresponding to the conductive portion 5 is prepared. Examples of a material included in the intaglio 6 may include nickel, silicon, silicon dioxide, organic silica, glassy carbon, a thermoplastic resin, a light curing resin, etc. A width of the recessed portion 61 is preferably within a range of 50 nm to 1,000 μm, more preferably within a range of 500 nm to 150 μm, even more preferably within a range of 1 μm to 10 μm, and further even more preferably within a range of 1 μm to 5 μm. A depth of the recessed portion 61 is preferably within a range of 50 nm to 3,000 μm, more preferably within a range of 500 nm to 450 μm, and even more preferably within a range of 500 nm to 10 μm.

A release layer made of a graphite-based material, a silicone-based material, a fluorine-based material, a ceramic-based material, an aluminum-based material, etc. is preferably formed on a surface of the intaglio 6 including the recessed portion 61 to improve a release property.

Subsequently, the recessed portion 61 of the intaglio 6 is filled with an electrically conductive material 7. The above-described conductive paste is used as the electrically conductive material 7. Examples of a method of filling the recessed portion 61 of the intaglio 6 with the electrically conductive material 7 may include a dispensing method, an ink-jet method, screen printing, etc. Otherwise, the examples may include a method in which after coating using a slit coating method, a bar coating method, a blade coating method, a dip coating method, a spray coating method, or a spin coating method, the electrically conductive material coating a portion other than the concave portion is removed by wiping, scraping, sucking, sticking, washing, or blowing.

A composition, etc. of the electrically conductive material may be appropriately used properly according to a shape of the intaglio, etc.

Subsequently, as illustrated in FIG. 8(b), the conductive portion 5 is formed by heating the electrically conductive material 7 that fills the recessed portion 61 of the intaglio 6. A condition for heating the electrically conductive material 7 may be appropriately set depending on the composition of the electrically conductive material 7, etc. When heating treatment is performed, a mold (not illustrated) having a concave-convex shape in a longitudinal direction is pressed against the electrically conductive material 7 filling the recessed portion 61 to heat the electrically conductive material 7. Otherwise, content of water or solvent contained in the electrically conductive material 7 is adjusted such that an upper surface of the electrically conductive material 7 has a concave-convex shape after the electrically conductive material 7 is heated.

In addition, the electrically conductive material 7 contracts in volume through the heating treatment. In this instance, an external surface of the electrically conductive material 7 except for the upper surface is formed in a shape along the recessed portion 61. Meanwhile, a surface having a concave-convex shape (that is, the contact surface 51) is formed on an upper surface of the conductive portion 5. In addition, when the electrically conductive material 7 contracts in volume, a void 62 connected to an external space of the recessed portion 61 is formed on the conductive portion 5 inside the recessed portion 61 of the intaglio 6. A method of processing the electrically conductive material 7 is not restricted to heating. The electrically conductive material 7 may be irradiated with an energy ray such as an infrared ray, an ultraviolet ray, laser light, etc. or may only be dried.

Subsequently, as illustrated in FIG. 8(c), a resin material 8 for forming the adhesive layer 4 is applied onto the intaglio 6. Examples of the resin material 8 may include the same material as the above-mentioned material included in the adhesive layer 4. Examples of a method of applying the resin material 8 onto the intaglio 6 may include screen printing, a spray coating method, a bar coating method, a dip method, an ink-jet method, etc. Through this application, the resin material 8 penetrates into the recessed portion 61 including the concave-convex shape of the contact surface 51.

Subsequently, as illustrated in FIG. 8(d), a substrate is disposed from above the resin material 8 applied onto the intaglio 6. This disposition is preferably performed in a vacuum in order to inhibit a bubble from penetrating between the resin material 8 and the substrate 3. Subsequently, the resin material 8 is hardened. Examples of a method of hardening the resin material 8 may include irradiation with an energy ray such as an infrared ray, an ultraviolet ray, laser light, etc., heating, annealing, drying, etc. In this way, the adhesive layer 4 is formed, and the substrate 3 and the conductive portion 5 are bonded and fixed to each other through the adhesive layer 4. In this instance, when the resin material 8 filling the void 62 is hardened, the protrusion 42 of the adhesive layer 4 is formed.

In the present embodiment, the substrate 3 is stacked after the resin material 8 is applied onto the intaglio 6. However, the invention is not particularly restricted thereto. For example, the substrate 3 may be stacked on the intaglio 6 through the resin material 8 by disposing the substrate 3, in which the resin material 8 is applied onto the main surface (surface facing the intaglio 6) of the substrate 3 in advance, on the intaglio 6.

Subsequently, the substrate 3, the adhesive layer 4, and the conductive portion 5 may be released from a mold, thereby obtaining the wiring board 1 (see FIG. 8(e)). In this instance, as in the present embodiment, when the recessed portion 61 of the intaglio 6 has a tapered shape, a mold release operation may be facilitated.

The wiring body 2 and the wiring board 1 in the present embodiment accomplish the following effects.

In the present embodiment, in the section view in the longitudinal direction, the contact surface 51 is set to a surface having a concave-convex shape, and Formula (12) below is satisfied. In this way, the mechanical joining force between the conductive portion 5 and the adhesive layer 4 is improved, and separation between the conductive portion 5 and the adhesive layer 4 is suppressed. In other words, when the contact surfaces 51 and 43 between the conductive portion 5 and the adhesive layer 4 are set to surfaces having concave-convex shapes, adhesion between the conductive portion 5 and the adhesive layer 4 is improved due to an anchoring effect. In addition, a contact area between the conductive portion 5 and the adhesive layer 4 increases, and the conductive portion 5 and the adhesive layer 4 may be strongly bonded to each other. In this case, adhesion (bond strength) between the conductive portion 5 and the adhesive layer 4 in the wiring body 2 of the present embodiment is preferably 10 N/cm or more.

$$L_1 > L_2 \qquad (12)$$

However, in the above Formula (12), $L_1$ denotes a unit length of the contact surface 51 in the section view in the longitudinal direction, and $L_2$ denotes a unit length of the top surface 52 in the section view in the longitudinal direction.

In addition, in the present embodiment, the adhesive layer 4 serving as a resin layer has the smooth portion 41 and the protrusion 42. However, the protrusion 42 protrudes from the main surface 411 of the smooth portion 41 toward the conductive portion 5 side to correspond to a portion supporting the conductive portion 5. Further, when the protrusion 42 comes into contact with the conductive portion 5, the contact surface 51 of the conductive portion 5 is positioned on a side of the top surface 52 of the conductive portion 5 with respect to the main surface 411 of the smooth portion 41. For this reason, the adhesive layer 4 in the portion supporting the conductive portion 5 is formed to be thicker by a thickness of the protrusion 42, rigidity of the adhesive layer 4 in the portion supporting the conductive portion 5 is improved, and thus separation between the conductive portion 5 and the adhesive layer 4 may be suppressed.

In addition, in the present embodiment, since the contact surface 51 of the conductive portion 5 is positioned on the side of the top surface 52 of the conductive portion 5 with respect to the main surface 411 of the smooth portion 41, the concave and convex portions of the contact surface 51 are included inside the protrusion 42. For this reason, the smooth portion 41 is not corroded by the conductive portion 5, and a substantially constant thickness may be maintained. In this way, a thin-walled portion is not generated in the smooth portion 41, and thus durability of the adhesive layer 4 may be improved.

In addition, in the present embodiment, while the contact surface 43 of the adhesive layer 4 (that is, a surface of the protrusion 42 coming into contact with the contact surface 51 of the conductive portion 5) is formed in a concave and convex shape, the main surface 411 of the smooth portion 41 is formed to be substantially flat. In this way, it is possible to improve an adhesive property between the adhesive layer 4 and the conductive portion 5, and to prevent light entering the wiring body 2 from the outside from being irregularly reflected on the main surface 411 of the smooth portion 41. That is, the wiring body 2 of the present embodiment may suppress separation between the adhesive layer 4 and the conductive portion 5, and improve visibility.

In addition, when the contact area between the adhesive layer 4 and the conductive portion 5 increases, the conductive portion 5 may be inhibited from remaining inside the recessed portion 61 of the intaglio 6 at the time of mold release when the wiring board 1 is manufactured. In addition, with the improvement in the release property, the conductive portion 5 may be thinned.

In addition, in the present embodiment, Formula (13) below is satisfied in terms of improving the mechanical joining force between the adhesive layer 4 and the conductive portion 5, and preventing damage to the conductive portion 5. That is, in a range less than a lower limit of Formula (13) below, the convex portion 512 becomes sharp, and the conductive portion 5 is damaged in the convex portion 512. Furthermore, there is a concern that separation between the adhesive layer 4 and the conductive portion 5 may occur. In addition, when the value is equal to an upper limit of Formula (13) below, the contact surface 51 is regarded as a surface having a concave-convex shape. Thus, there is a concern that the mechanical joining force between the adhesive layer and the conductive portion may not be improved, and separation between the adhesive layer and the conductive portion may occur.

$$S_2 > S_1 \geq 0.5 S_2 \tag{13}$$

However, in the above Formula (13), $S_1$ denotes an average gap between the contact surface 51 and the top surface 52 in the concave portion 511, and $S_2$ denotes an average gap between the contact surface 51 and the top surface 52 in the convex portion 512.

In addition, the contact surface 51 of the present embodiment includes a waveform in which the concave portion 511 and the convex portion 512 are alternately continued, and Formula (14) below is satisfied. In this way, the mechanical joining force between the conductive portion 5 and the adhesive layer 4 is further improved, and separation between the conductive portion 5 and the adhesive layer 4 is suppressed. In addition, when the contact surface 51 has a waveform in which the concave portion 511 and the convex portion 512 are periodically formed, stress is inhibited from being concentrated on a portion of the convex portion 512, and thus the convex portion 512 is inhibited from being damaged. In this way, separation between the conductive portion 5 and the adhesive layer 4 may be further inhibited from occurring.

$$100 D_1 \geq S_3 \geq 3 D_1 \tag{14}$$

However, in the above Formula (14), $S_3$ denotes an average gap between adjacent convex portions 512, and $D_1$ denotes the average particle diameter of the conductive particles CP.

In addition, in the present embodiment, Formula (15) below is satisfied. In this way, conductivity along the extending direction of the conductive portion 5 is ensured.

$$S_4 \geq 3 D_2 \tag{15}$$

However, in the above Formula (15), $S_4$ denotes the average gap between the contact surface 51 and the top surface 52 in the concave portion 511, and $D_2$ denotes the average particle diameter of the conductive particles CP.

In addition, in the present embodiment, the side surfaces 53 and 53 have straight line shapes in the section view in the short direction, and are formed to be inclined such that the side surfaces 53 and 53 approach each other as being separated from the contact surface 51. In this way, a mold release operation may be facilitated when the substrate 3, the adhesive layer 4, and the conductive portion 5 are released from the intaglio 6.

In addition, in the wiring body 2 of the present embodiment, a focus is on a relative relation between surface roughness (that is, a roughness parameter obtained by excluding a wavelength component) of the contact surface 51 of the conductive portion 5 and surface roughness of a surface of the conductive portion 5 except for the contact surface 51 (a surface including the top surface 52 and the side surface 53) in the section view in the short direction. Further, the surface roughness Ra of the contact surface 51 is set to be relatively rougher than the surface roughness Ra of the other surface. For this reason, it is possible to suppress diffused reflection of light entering from the outside while strongly bonding the adhesive layer 4 and the conductive portion 5 together. In particular, when the width of the conductive portion 5 is within a range of 1 μm to 5 μm, and when a relative relation between the surface roughness of the contact surface 51 and the surface roughness of the other surface satisfies the above-described relation, it is possible to noticeably accomplish the effect that diffused reflection of light entering from the outside may be suppressed while strongly bonding the adhesive layer 4 and the conductive portion 5 together.

In addition, in the present embodiment, the side surface 53 extends to substantially match the virtual straight line passing through the first and second portions 531 and 532. In this case, the side surface does not have a shape recessed inward from the virtual straight line passing through the first and second portions 531 and 532 (a shape in which a hem of the conductor pattern widens) in the cross section of the conductive portion 5 in the short direction. Thus, diffused reflection of light entering from the outside of the wiring body 2 is suppressed. In this way, visibility of the wiring body 2 may be further improved.

In addition, in the present embodiment, when the surface roughness Ra of the contact surface 51 is set to be relatively rougher than the surface roughness Ra of surfaces except for the contact surface 51 (the surfaces including the top surface 52 and the side surface 53), a diffuse reflectance of the wiring body 2 on the other surface side is relatively smaller than a diffuse reflectance of the wiring body 2 on the contact surface 51 side. Herein, when the diffuse reflectance of the wiring body 2 is small, it is possible to inhibit the conductive portion 5 from appearing white, and to suppress a decrease in contract in a region in which the conductive portion 5 may be visually recognized. In this way, it is possible to further improve visibility of the wiring body 2 of the present embodiment.

Effects of the present embodiment will be described below in detail. A wiring body in which a conductive portion is formed on a resin layer was manufactured according to the above-described manufacturing method. A width of the conductive portion was set to 2 μm. Referring to the conductive portion, when a length of a unit region W in a longitudinal direction is set to 12.5 μm, a unit length $L_1$ of a contact surface was 14.9 μm, and a unit length $L_2$ of a top surface was 12.9 μm. In addition, an average gap $S_1$, $S_4$ between the contact surface and the top surface in a concave portion was 1.4 μm, and an average gap $S_2$ between the contact surface and the top surface in a convex portion was 1.9 μm. In addition, an average gap $S_3$ between adjacent convex portions was 5.8 μm. An average particle diameter D of conductive particles was 0.3 μm. In the wiring body, a relation between the unit length $L_1$ of the contact surface and the unit length $L_2$ of the top surface 52 satisfies the above Formula (12). In addition, a relation between the average gap $S_1$ between the contact surface and the top surface in the concave portion and the average gap $S_2$ between the contact surface and the top surface in the convex portion satisfies the above Formula (13). In addition, a relation between the average particle diameter D of conductive particles and the average gap $S_3$ between adjacent convex portions satisfies the above Formula (14). In addition, a relation between the average gap $S_4$ between the contact surface and the top surface in the concave portion and the average particle diameter D of conductive particles satisfies the above Formula (15).

A Sia test was conducted on the wiring body to verify bond strength between the resin layer and the conductive portion in the wiring body. A Sia tool having a distal end diameter of 30 μm was used. This Sia tool was moved at 50 μm/S in parallel to a side surface of the conductive portion to obtain a force when the conductive portion was separated from the resin layer. The test was conducted on the wiring body at eight arbitrary positions using the above-described method, and an average of obtained forces was set to bond strength between the resin layer and the conductive portion. As a result of conducting the Sia test, bond strength between the resin layer and the conductive portion in the wiring body was 43 mN.

Incidentally, EIAJ ED-4703 (Standards of Electronic Industries Association of Japan) determines that wire bond strength (bond strength) in a wire having a diameter of 0.018 mm used for a semiconductor device needs to be at least within a range of 15 mN to 30 mN. However, bond strength between the resin layer and the conductive portion in the wiring body is sufficiently large when compared to the necessary bond strength.

In addition, JPCA-BM03 (Standards of Japan Electronics Packaging and Circuits Association) determines that peeling intensity of copper foil needs to be 3.5 N/cm or more. According to WO 2012-169074 A, peeling intensity of copper foil obtained using a lamination process or a casting process substantially needs to be 10 N/cm or more. However, a value obtained by dividing the bond strength between the resin layer and the conductive portion in the wiring body by the distal end diameter of the Sia tool is 14 N/cm, the peeling intensity is sufficiently large when compared to the necessary peeling intensity. In this way, it has been found that a characteristic of the wiring body contributes to suppression of separation between the resin layer and the conductive portion.

Figure 9:
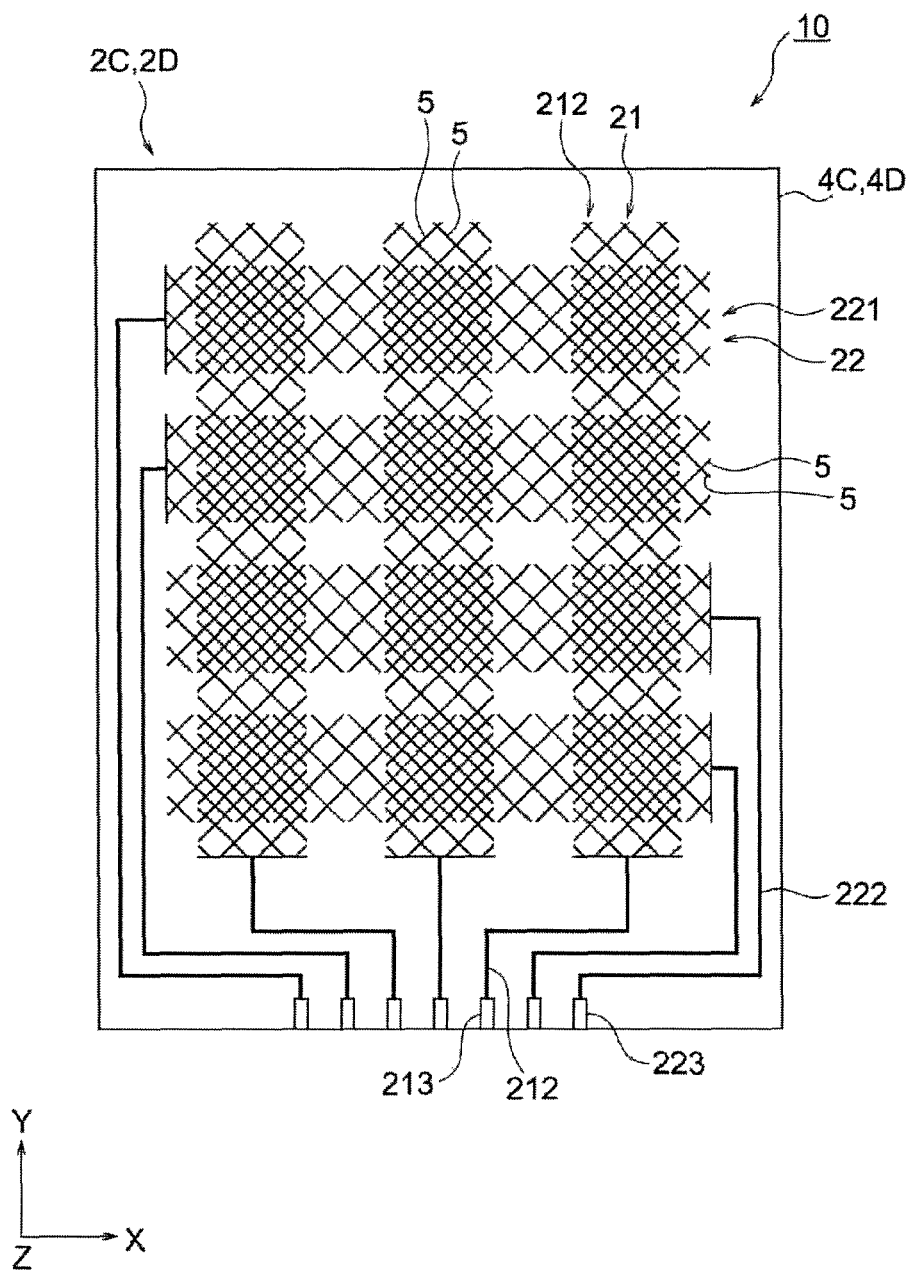
FIG. 9 is a plan view illustrating a touch sensor in the embodiment of the invention.
Figure 10:
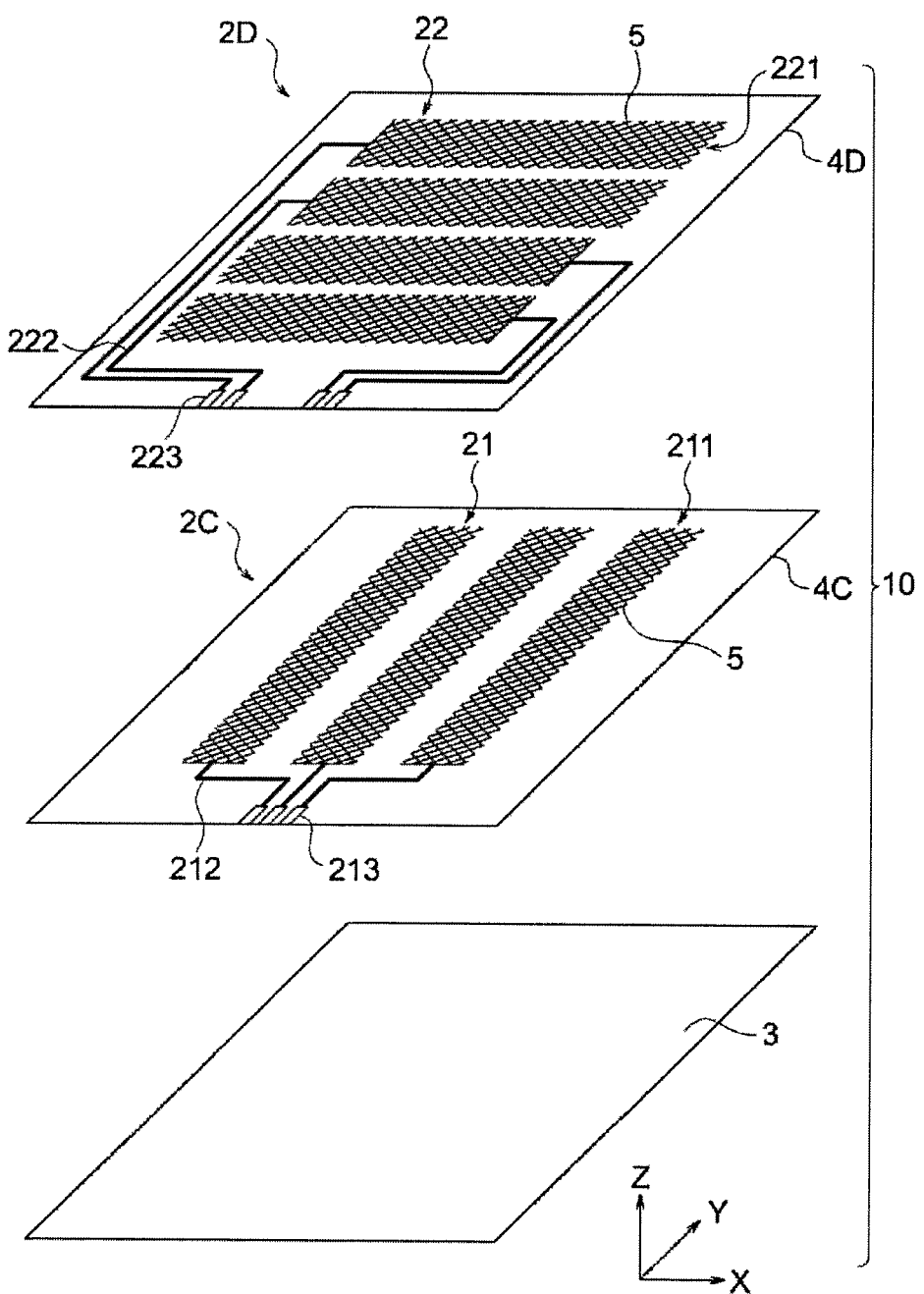
FIG. 10 is an exploded perspective view illustrating the touch sensor in the embodiment of the invention.

A description will be given of an example of a touch sensor 10 configured by stacking two wiring bodies described above with reference to FIG. 9 and FIG. 10. FIG. 9 is a plan view illustrating the touch sensor in the embodiment of the invention. FIG. 10 is an exploded perspective view illustrating the touch sensor in the embodiment of the invention.

As illustrated in FIG. 9, the touch sensor 10 of the present embodiment is a touch panel sensor corresponding to a projection-type capacitive sensing method. For example, the touch sensor 10 is combined with a display device (not illustrated) and used as an input device having a function of detecting a touch position. A liquid crystal display, an organic electro luminescence (EL) display, electronic paper, etc. may be used as the display device without particular restriction. The touch sensor 10 includes a detection electrode and a driving electrode (an electrode 21 and an electrode 22 described below) disposed to face each other, and a predetermined voltage is periodically applied between the two electrodes from an external circuit (not illustrated).

In the touch sensor 10, for example, when a finger (external conductor) of an operator approaches the touch sensor 10, a capacitor (electrostatic capacity) is formed between the external conductor and the touch sensor, and an electrical state between the two electrodes changes. The touch sensor 10 may detect an operation position of the operator based on an electrical change between the two electrodes.

As illustrated in FIG. 9 and FIG. 10, the touch sensor 10 includes a wiring board that has a substrate 3, a first wiring body 2C, and a second wiring body 2D. The first wiring body 2C includes a resin layer 4C and a conductive layer 21. The conductive layer 21 includes detection electrodes 211, lead-out wires 212, and terminals 213. The number of electrodes 211 included in the first wiring body 2C is not particularly restricted, and may be arbitrarily set. In addition, the numbers of lead-out wires 212 and terminals 213 included in the first wiring body 2C are set depending on the number of electrodes 211.

The respective electrodes 211 extend in a Y direction in the figure, and the electrodes 211 is arranged in an X direction in the figure. One ends of the lead-out wires 212 are connected to one ends of the electrodes 211 in a longitudinal direction, respectively. The terminals 213 electrically connected to an external circuit are connected to the other ends of the lead-out wires 212, respectively.

The electrodes 211 have a mesh shape (net shape) including straight line-shaped conductive portions 5. In the present embodiment, a shape of each net including the conductive portion 5 is set to a substantially square shape. However, the shape is not particularly restricted thereto. The shape of each net may correspond to geometric forms below. That is, the shape of the net may correspond to a triangle such as a regular triangle, an isosceles triangle, a right triangle, etc., and may correspond to a rectangle such as a parallelogram, a trapezoid, etc. Alternatively, the shape of the net may correspond to an n-polygon such as a hexagon, an octagon, a dodecagon, an icosagon, etc., a circle, an ellipse, a star, etc.

In this way, a geometric form obtained by repeating various figure units may be used as the shape of each net of the electrodes 211. In the present embodiment, the conductive portion 5 corresponds to a straight line shape. However, the conductive portion 5 is not particularly restricted thereto when the conductive portion 5 linearly extends. For example, the conductive portion 5 may correspond to a curved shape, a horseshoe shape, a zigzag line shape, etc.

Similarly to the electrodes 211, the lead-out wires 212 and the terminals 213 include the straight line-shaped conductive portions 5. The lead-out wires 212 and the terminals 213 may include a single conductive portion 5, or correspond to a mesh shape (net shape) including conductive portions 5.

The resin layer 4C has the same configuration as that of the adhesive layer 4 serving as the above-described resin layer, and thus a detailed description will be omitted.

The second wiring body 2D includes a resin layer 4D and a conductive layer 22. The conductive layer 22 includes electrodes 221, lead-out wires 222, and terminals 223. The number of electrodes 221 included in the second wiring body 2D is not particularly restricted, and may be arbitrarily set. In addition, the numbers of lead-out wires 222 and terminals 223 included in the second wiring body 2D are set depending on the number of electrodes 221.

The respective electrodes 221 extend in a direction (the X direction in the figure) orthogonal to the respective electrodes 221 of the first wiring body 2C, and the electrodes 221 is arranged in the Y direction in the figure. One ends of the lead-out wires 222 are connected to one ends of the electrodes 221 in a longitudinal direction, respectively. In addition, the terminals 223 are provided to the other ends of the lead-out wires 222, respectively. The terminals 223 are electrically connected to the external circuit. The electrodes 221, the lead-out wires 222, and the terminals 223 included in the conductive layer 22 of the second wiring body 2D basically have the same structure as that of the electrodes 211, the lead-out wires 212, and the terminals 213 included in the conductive layer 21 of the first wiring body 2C. Thus, a detailed description of the electrodes 221, the lead-out wires 222, and the terminals 223 will be omitted.

The resin layer 4D covers the first wiring body 2C. In the present embodiment, the resin layer 4D functions as an insulating portion that ensures insulation between the conductive layer 21 of the first wiring body 2C and the conductive layer 22 of the second wiring body 2D. A lower surface of the resin layer 4D is a surface having a concave-convex shape corresponding to a concave-convex shape of the first wiring body 2C. However, a basic structure thereof is the same as that of the resin layer 4C of the first wiring body 2C.

In the above-described touch sensor 10, a mechanical joining force between the conductive layer 21 including the conductive portion 5 and the resin layer 4C is improved, and separation between the conductive layer 21 and the resin layer 4C is suppressed by including the first and second wiring bodies 2C and 2D. In addition, a mechanical joining force between the conductive layer 22 including the conductive portion 5 and the resin layer 4D is improved, and separation between the conductive layer 22 and the resin layer 4C is suppressed.

The above-described embodiment has been described to facilitate understanding of the invention, and has not been described to restrict the invention. Therefore, each element disclosed in the above embodiment is intended to include all changes of design or equivalents falling within a technical scope of the invention.

Figure 11:
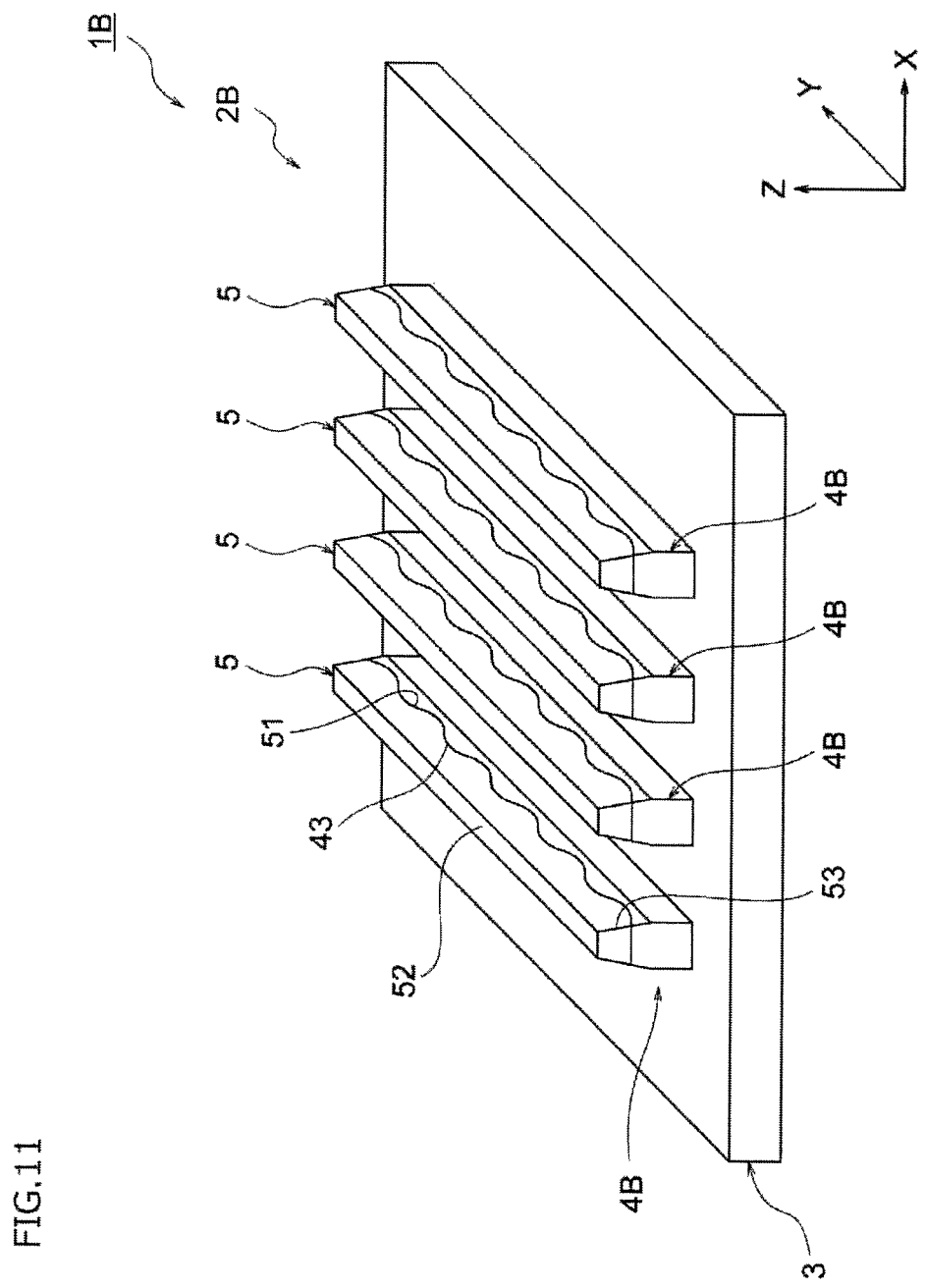
FIG. 11 is a perspective view illustrating a first modified example of the wiring board in the embodiment of the invention.
Figure 12:
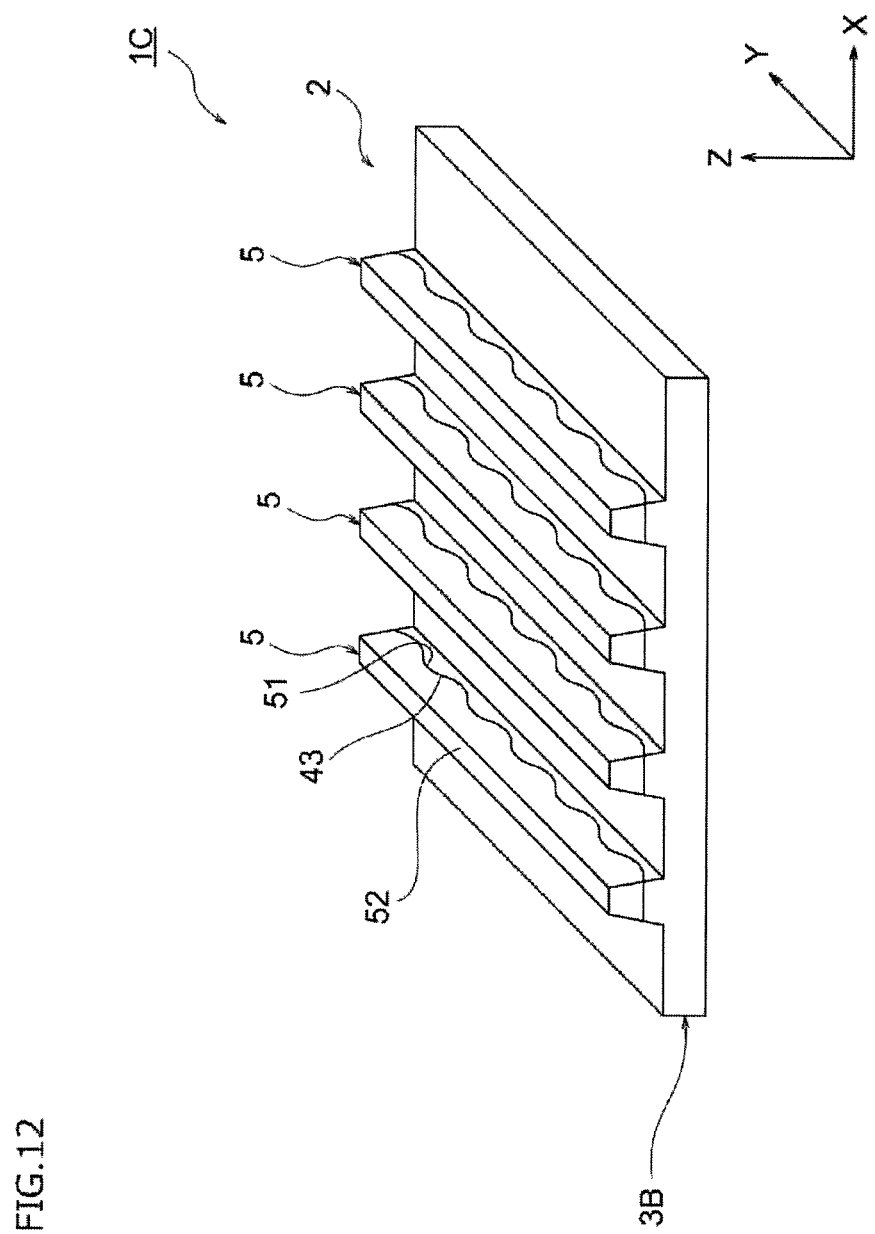
FIG. 12 is a perspective view illustrating a second modified example of the wiring board in the embodiment of the invention.
Figure 13:
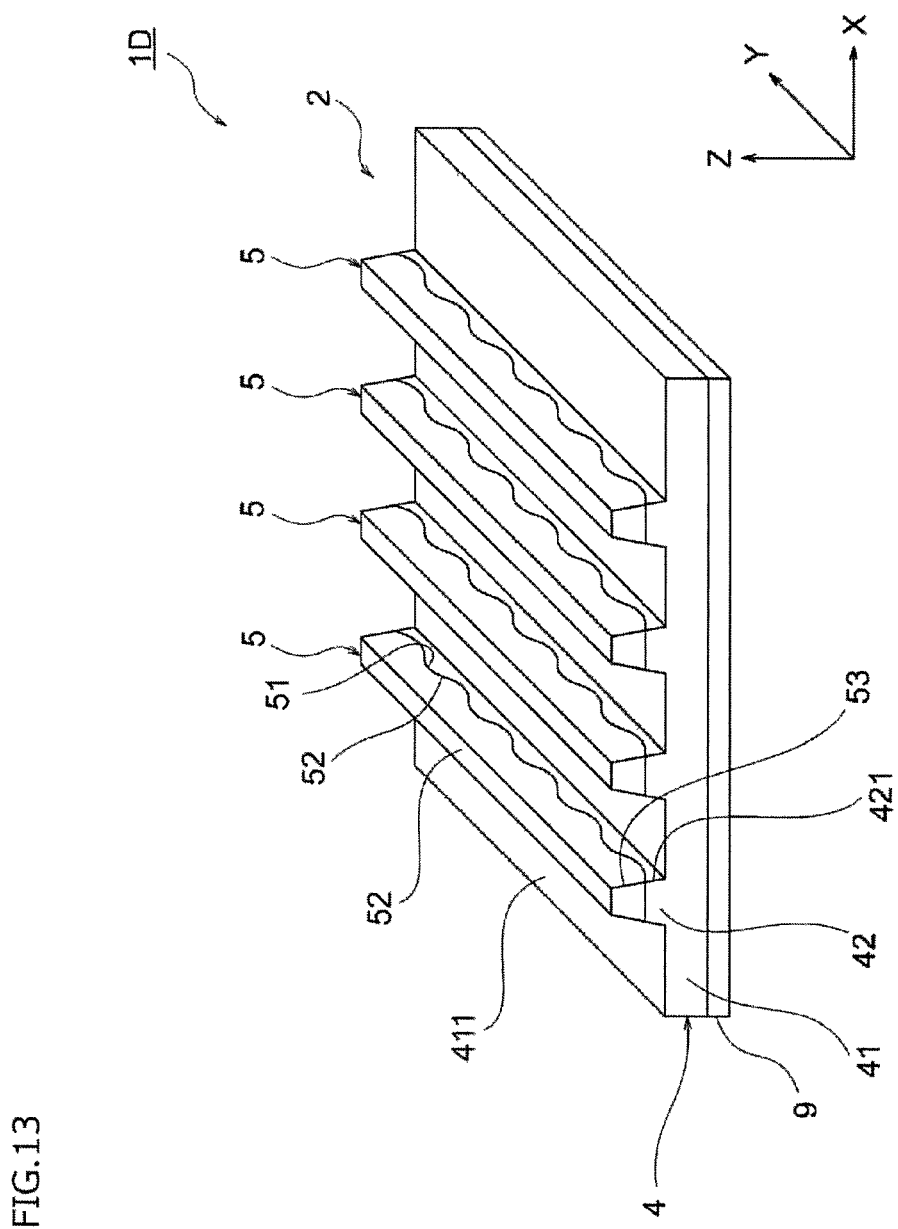
FIG. 13 is a perspective view illustrating a third modified example of the wiring board in the embodiment of the invention.

FIG. 11 is a perspective view illustrating a first modified example of the wiring board in the embodiment of the invention. FIG. 12 is a perspective view illustrating a second modified example of the wiring board in the embodiment of the invention. FIG. 13 is a perspective view illustrating a third modified example of the wiring board in the embodiment of the invention.

In addition, for example, as in a wiring board 1B illustrated in FIG. 11, an adhesive layer 4B obtained by omitting a portion of the smooth portion 41 of the adhesive layer 4 other than a portion formed on a lower surface side of the conductive portion 5 may be formed (that is, a wiring body 2B may be formed). For example, the adhesive layer 4B may be formed by forming an adhesive layer on the whole main surface 31 of the substrate 3 to manufacture a wiring board, and then removing the adhesive layer except for a portion around the conductive portion 5 using etching, etc.

In this case, it is possible to improve optical transparency of the whole wiring board 1B, and to improve visibility when the wiring board 1B is used for a touch panel, etc. Further, when a colored material is used as the material included in the adhesive layer 4, it is possible to suppress diffused reflection of light in the conductive portion 5, and to further improve visibility when the wiring board 1B is used for the touch panel, etc.

Alternatively, as in a wiring board 1C illustrated in FIG. 12, the substrate 3 may be omitted from the above-described embodiment. For example, after the intaglio 6 is filled with the electrically conductive material 7 and heated, the resin material 8 is applied onto the intaglio 6, and the resin material 8 is hardened. Then, the wiring board 1C may be manufactured by releasing the heated electrically conductive material 7 (conductive portion 5) and the resin material 8 from the intaglio 6 using the resin material 8 as a substrate 3B. In this case, the "substrate 3B" corresponds to an example of a "resin layer" and a "substrate" in the invention.

In addition, in this case, as illustrated in FIG. 13, for example, a wiring board 1D may be configured in a mode in which a release sheet 9 is provided on a lower surface of the adhesive layer 4, and the wiring board 1D is mounted by peeling off the release sheet 9 and bonding the wiring board 1D to a mounting object (a film, surface glass, a polarizing plate, a display, etc.) at the time of amounting. In this case, the mounting object corresponds to an example of a "support" in the invention. Alternatively, it is possible to employ a mode in which a resin portion covering the wiring body from the resin layer side is further provided, and the wiring board 1D is mounted by being bonded to the above-mentioned mounting object through the resin portion. Alternatively, it is possible to employ a mode in which a resin portion covering the wiring board from the conductive portion side is provided, and the wiring board 10 is mounted by being bonded to the above-mentioned mounting object through the resin portion. In these cases, the mounting object on which the wiring body is mounted corresponds to an example of a support of the invention.

In addition, the touch sensor 10 of the above-described embodiment is a touch sensor corresponding to a projection-type capacitive sensing method using two wiring bodies 2C and 2D. However, the invention is not restricted thereto. The invention is applicable to a touch sensor corresponding to a surface-type (capacitive coupling-type) capacitive sensing method using one wiring body.

In addition, a metal material mixed with a carbon-based material may be used as the conductive particles CP of the conductive portion 5. In this case, for example, the carbon-based material may be disposed on a side of the top surface 52 of the conductive portion 5, and the metal-based material may be disposed on the contact surface 51 side. Alternatively, reversely, the metal-based material may be disposed on the side of the top surface 52 of the conductive portion 5, and the carbon-based material may be disposed on the contact surface 51 side.

Further, in the above-described embodiment, a description has been given on the assumption that the wiring body 2 is used for the touch sensor, etc. However, the invention is not particularly restricted thereto. For example, the wiring body may be used as a heater by electrifying the wiring body to generate heat using resistance heating, etc. In this case, a carbon-based material having relatively high electrical resistivity is preferably used as the conductive particles of the conductive portion. Alternatively, the wiring body may be used as an electromagnetic shield by grounding a part of the conductive portion of the wiring body. Alternatively, the wiring body may be used as an antenna. In this case, a mounting object on which the wiring body is mounted corresponds to an example of the support of the invention.

EXPLANATIONS OF LETTERS OR NUMERALS

10 . . . touch panel
1, 1B to 10 . . . wiring board
2, 2B . . . wiring body
  21 . . . conductive layer 211 ... electrode
212 ... lead-out wire
213 ... terminal
22 ... conductive layer
221 ... electrode
212 ... lead-out wire
213 ... terminal
3, 3B ... substrate
31 ... main surface
4, 4B ... adhesive layer
41 ... smooth portion
411 ... main surface
42 ... protrusion
421 ... side surface
43 ... contact surface
5 ... conductive portion
51 ... contact surface
511 ... concave portion
512 ... convex portion
513 ... first approximate line
513a, 513b ... inflection point
52 ... top surface
521 ... corner portion
522 ... second approximate line
522a, 522b ... projection point
523 ... flat portion
53 ... side surface
531 ... first portion
532 ... second portion
533 ... flat portion
CP, CPa ... conductive particle
BD, BDa ... binder
W ... unit region
6 ... intaglio
61 ... recessed portion
62 ... void
7 ... electrically conductive material
8 ... resin material
9 ... release sheet

The invention claimed is:

1. A wiring body comprising:
a conductive portion including:
   a first surface having a concave-convex in a section view in a longitudinal direction of a body of the conductive portion, wherein the first surface includes a concave portion and a convex portion;
   a second surface facing the first surface, and conductive particles dispersed within the conductive portion; and
a resin layer formed by being stacked on the first surface, wherein
the resin layer includes:
   a smooth portion provided at a substantially constant thickness and having a substantially smooth main surface; and
   a protrusion provided on the smooth portion to correspond to the conductive portion and protruding from the main surface toward a side of the conductive portion,
the protrusion comes into contact with the first surface and includes a concave-convex surface complementary to the concave-convex shape of the first surface, the first surface is positioned on a side of the second surface with respect to the main surface, and
the following Formula (1) is satisfied:

$$L_1 > L_2 \qquad (1)$$

in the Formula (1), $L_1$ denotes a unit length of the first surface in the section view in the longitudinal direction of the body of the conductive portion, and $L_2$ denotes a unit length of the second surface in the section view in the longitudinal direction of the body of the conductive portion.

2. The wiring body according to claim 1, wherein the following Formula (2) is satisfied:

$$S_2 > S_1 \geq 0.5 S_2 \qquad (2)$$

in the Formula (2), $S_1$ denotes an average gap between the first surface and the second surface in the concave portion, and $S_2$ denotes an average gap between the first surface and the second surface in the convex portion.

3. The wiring body according to claim 1, wherein the first surface includes a waveform in which the concave portion and the convex portion are alternately continued, and
the following Formula (3) is satisfied:

$$100 D_1 \geq S_3 \geq 3 D_1 \qquad (3)$$

in the Formula (3), $S_3$ denotes an average gap between adjacent convex portions, and $D_1$ denotes an average particle diameter of the conductive particles.

4. The wiring body according to claim 1, wherein the following Formula (4) is satisfied:

$$S_4 \geq 3 D_2 \qquad (4)$$

in the Formula (4), $S_4$ denotes an average gap between the first surface and the second surface in the concave portion, and $D_2$ denotes an average particle diameter of the conductive particles.

5. The wiring body according to claim 1, wherein an external shape of the conductive portion in a cross section in a short direction includes two straight line-shaped side surfaces inclined such that the side surfaces approach each other as being separated from the first surface.

6. A wiring board comprising:
the wiring body according to claim 1; and
a support that supports the wiring body.

7. A touch senor comprising the wiring board according to claim 6.

8. The wiring body according to claim 1, wherein the following Formula (5) is satisfied:

$$S_5 \geq 3 D_3 \qquad (5)$$

in the Formula (5), $S_5$ denotes an average height difference between the concave portion and the convex portion, and $D_3$ denotes an average particle diameter of the conductive particles.

* * * * *